United States Patent
Clemons et al.

(10) Patent No.: US 11,901,222 B2
(45) Date of Patent: Feb. 13, 2024

(54) MULTI-STEP PROCESS FOR FLOWABLE GAP-FILL FILM

(71) Applicant: Applied Materials, Inc., Santa Clara, CA (US)

(72) Inventors: Maximillian Clemons, Sunnyvale, CA (US); Nikolaos Bekiaris, Campbell, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 630 days.

(21) Appl. No.: 16/792,646

(22) Filed: Feb. 17, 2020

(65) Prior Publication Data

US 2021/0257252 A1    Aug. 19, 2021

(51) Int. Cl.
*H01L 21/768* (2006.01)
*H01J 37/32* (2006.01)
*H01L 21/02* (2006.01)

(52) U.S. Cl.
CPC .. *H01L 21/76837* (2013.01); *H01J 37/32009* (2013.01); *H01L 21/02271* (2013.01); *H01J 2237/3321* (2013.01)

(58) Field of Classification Search
CPC ........... H01L 21/02126; H01L 21/0214; H01L 21/0228; H01L 21/02211; H01L 21/02164; H01L 21/02219; H01L 21/02167; H01L 21/0217; H01L 21/02216; H01L 21/02271; H01L 21/02274; H01L 21/02326;

(Continued)

(56) References Cited

U.S. PATENT DOCUMENTS

| 3,684,592 A | 8/1972 | Chang et al. |
| 3,749,383 A | 7/1973 | Voigt et al. |

(Continued)

FOREIGN PATENT DOCUMENTS

| CN | 1280875 C | 10/2006 |
| CN | 101871043 A | 10/2010 |

(Continued)

OTHER PUBLICATIONS

International Search Report and Written Opinion for PCT/US2021/014991 dated May 17, 2021.

(Continued)

*Primary Examiner* — Brook Kebede
(74) *Attorney, Agent, or Firm* — Patterson + Sheridan, LLP

(57) ABSTRACT

Generally, examples described herein relate to methods and processing systems for performing multiple processes in a same processing chamber on a flowable gap-fill film deposited on a substrate. In an example, a semiconductor processing system includes a processing chamber and a system controller. The system controller includes a processor and memory. The memory stores instructions, that when executed by the processor cause the system controller to: control a first process within the processing chamber performed on a substrate having thereon a film deposited by a flowable process, and control a second process within the process chamber performed on the substrate having thereon the film. The first process includes stabilizing bonds in the film to form a stabilized film. The second process includes densifying the stabilized film.

7 Claims, 10 Drawing Sheets

(58) Field of Classification Search
CPC ......... H01L 21/02329; H01L 21/02337; H01L 21/0234; H01L 21/02348; H01L 21/76224; H01L 21/76837; H01L 21/67184; H01L 21/67167; H01L 21/76229; H01L 21/67207; C23C 16/045; C23C 16/325; C23C 16/4554; C23C 16/45523; C23C 16/345; C23C 16/505; H01J 37/32009; H01J 37/32899
See application file for complete search history.

(56) References Cited

U.S. PATENT DOCUMENTS

| | | |
|---|---|---|
| 3,758,316 A | 9/1973 | Sowards et al. |
| 4,409,260 A | 10/1983 | Pastor et al. |
| 4,424,101 A | 1/1984 | Nowicki |
| 4,524,587 A | 6/1985 | Kantor |
| 4,576,652 A | 3/1986 | Hovel et al. |
| 4,589,193 A | 5/1986 | Goth et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,747,383 A | 5/1998 | Chen et al. |
| 5,808,245 A | 9/1998 | Wiese et al. |
| 5,857,368 A | 1/1999 | Grunes et al. |
| 5,858,051 A | 1/1999 | Komiyama et al. |
| 5,877,087 A | 3/1999 | Mosely et al. |
| 5,879,756 A | 3/1999 | Fathi et al. |
| 5,880,041 A | 3/1999 | Ong |
| 5,886,864 A | 3/1999 | Dvorsky |
| 5,888,888 A | 3/1999 | Talwar et al. |
| 5,918,149 A | 6/1999 | Besser et al. |
| 5,940,985 A | 8/1999 | Kamikawa et al. |
| 6,071,810 A | 6/2000 | Wada et al. |
| 6,077,571 A | 6/2000 | Kaloyeros |
| 6,082,950 A | 7/2000 | Altwood et al. |
| 6,086,730 A | 7/2000 | Liu |
| 6,103,585 A | 8/2000 | Michaelis |
| 6,136,664 A | 10/2000 | Economikos et al. |
| 6,140,235 A | 10/2000 | Yao et al. |
| 6,150,286 A | 11/2000 | Sun et al. |
| 6,164,412 A | 12/2000 | Allman |
| 6,207,487 B1 | 3/2001 | Kim et al. |
| 6,242,368 B1 | 6/2001 | Holmer et al. |
| 6,242,808 B1 | 6/2001 | Shimizu et al. |
| 6,251,242 B1 | 6/2001 | Fu et al. |
| 6,251,751 B1 | 6/2001 | Chu et al. |
| 6,277,249 B1 | 8/2001 | Gopalraja et al. |
| 6,284,646 B1 | 9/2001 | Leem |
| 6,299,753 B1 | 10/2001 | Chao et al. |
| 6,305,314 B1 | 10/2001 | Sneh et al. |
| 6,319,766 B1 | 11/2001 | Bakli et al. |
| 6,319,847 B1 | 11/2001 | Ishikawa |
| 6,334,249 B2 | 1/2002 | Hsu |
| 6,334,266 B1 | 1/2002 | Moritz et al. |
| 6,335,240 B1 | 1/2002 | Kim et al. |
| 6,344,249 B1 | 2/2002 | Maruyama et al. |
| 6,344,419 B1 | 2/2002 | Forster et al. |
| 6,348,376 B2 | 2/2002 | Lim et al. |
| 6,355,558 B1 | 3/2002 | Dixit |
| 6,358,829 B2 | 3/2002 | Yoon et al. |
| 6,368,412 B1 | 4/2002 | Gomi |
| 6,372,598 B2 | 4/2002 | Kang et al. |
| 6,387,764 B1 | 5/2002 | Curtis et al. |
| 6,399,486 B1 | 6/2002 | Chen et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,442,980 B2 | 9/2002 | Preston et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,490 B1 | 10/2002 | Shamouilian et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,500,603 B1 | 12/2002 | Shioda |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,583,497 B2 | 6/2003 | Xia et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,619,304 B2 | 9/2003 | Worm |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,657,304 B1 | 12/2003 | Woo et al. |
| 6,660,660 B2 | 12/2003 | Haukka et al. |
| 6,686,271 B2 | 2/2004 | Raaijmakers et al. |
| 6,780,777 B2 | 8/2004 | Yun et al. |
| 6,797,336 B2 | 9/2004 | Garvey et al. |
| 6,825,115 B1 | 11/2004 | Xiang et al. |
| 6,841,432 B1 | 1/2005 | Takemura et al. |
| 6,849,122 B1 | 2/2005 | Fair |
| 6,867,130 B1 | 3/2005 | Karlsson et al. |
| 6,867,152 B1 | 3/2005 | Hausmann et al. |
| 6,889,627 B1 | 5/2005 | Hao |
| 6,897,118 B1 | 5/2005 | Poon et al. |
| 6,969,448 B1 | 11/2005 | Lau |
| 7,055,333 B2 | 6/2006 | Leitch et al. |
| 7,084,079 B2 | 8/2006 | Conti et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,429,402 B2 | 9/2008 | Gandikota et al. |
| 7,432,200 B2 | 10/2008 | Chowdhury et al. |
| 7,460,760 B2 | 12/2008 | Cho et al. |
| 7,465,650 B2 | 12/2008 | Derderian |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,629,227 B1 | 12/2009 | Wang et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,691,442 B2 | 4/2010 | Gandikota et al. |
| 7,709,320 B2 | 5/2010 | Cheng |
| 7,759,749 B2 | 7/2010 | Tanikawa |
| 7,825,038 B2 | 11/2010 | Ingle et al. |
| 7,825,042 B2 | 11/2010 | Mandal |
| 7,867,914 B2 | 1/2011 | Xi et al. |
| 7,867,923 B2 | 1/2011 | Mallick et al. |

(56) References Cited

U.S. PATENT DOCUMENTS

| | | |
|---|---|---|
| 7,891,228 B2 | 2/2011 | Ding et al. |
| 7,910,165 B2 | 3/2011 | Ganguli et al. |
| 7,964,505 B2 | 6/2011 | Khandelwal et al. |
| 7,964,506 B1 | 6/2011 | Ponnuswamy et al. |
| 8,027,089 B2 | 9/2011 | Hayashi |
| 8,278,224 B1 | 10/2012 | Mui et al. |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Liang et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |
| 8,647,992 B2 | 2/2014 | Liang et al. |
| 8,648,253 B1 | 2/2014 | Woods et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |
| 2003/0101938 A1 | 6/2003 | Ronsse et al. |
| 2003/0121887 A1 | 7/2003 | Garvey et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0194615 A1 | 10/2003 | Krauth |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0079086 A1 | 4/2006 | Boit et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |
| 2007/0111519 A1 | 5/2007 | Lubomirsky et al. |
| 2007/0116873 A1 | 5/2007 | Li et al. |
| 2007/0145416 A1 | 6/2007 | Ohta |

(56) References Cited

U.S. PATENT DOCUMENTS

| | | |
|---|---|---|
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |
| 2008/0121882 A1 | 5/2008 | Hwang et al. |
| 2008/0132050 A1 | 6/2008 | Lavoie |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1* | 7/2010 | Lee ................. H01L 21/316 257/E21.548 |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0153483 A1 | 6/2012 | Akolkar et al. |
| 2012/0175822 A1 | 7/2012 | Inamiya et al. |
| 2012/0177846 A1* | 7/2012 | Li ................. C23C 16/452 427/579 |
| 2012/0238108 A1* | 9/2012 | Chen ................. C23C 16/345 257/E21.282 |
| 2012/0252207 A1 | 10/2012 | Lei et al. |
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0239292 A1 | 8/2014 | Kim et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0102340 A1 | 4/2015 | Shimoda et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0329970 A1* | 11/2015 | Khan ................. H01L 21/67778 118/719 |
| 2015/0348824 A1 | 12/2015 | Kuenle et al. |

(56) References Cited

U.S. PATENT DOCUMENTS

| | | | |
|---|---|---|---|
| 2015/0357195 A1 | 12/2015 | Lam et al. |
| 2015/0364348 A1 | 12/2015 | Park et al. |
| 2015/0364554 A1 | 12/2015 | Kim et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0330980 A1* | 11/2018 | Liang ................ H01L 21/02274 |
| 2018/0337027 A1 | 11/2018 | L'Heureux et al. |
| 2018/0342384 A1 | 11/2018 | Wong et al. |
| 2018/0342396 A1 | 11/2018 | Wong et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0157075 A1* | 5/2019 | Tu ..................... H01L 29/66553 |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |
| 2021/0167235 A1 | 6/2021 | Li et al. |

FOREIGN PATENT DOCUMENTS

| | | |
|---|---|---|
| CN | 102386052 A | 3/2012 |
| CN | 102856234 A | 1/2013 |
| CN | 104047676 A | 9/2014 |
| CN | 104089491 A | 10/2014 |
| CN | 103035513 B | 10/2016 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 0840365 A3 | 10/2003 |
| JP | S63-004616 A | 1/1988 |
| JP | S6367721 A | 3/1988 |
| JP | H1218018 A | 8/1989 |
| JP | H04355922 A | 12/1992 |
| JP | H0521347 A | 1/1993 |
| JP | H06283496 A | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 200351474 A | 2/2003 |
| JP | 2003166065 A | 6/2003 |
| JP | 2003188387 A | 7/2003 |

(56) References Cited

FOREIGN PATENT DOCUMENTS

| | | |
|---|---|---|
| JP | 2003243374 A | 8/2003 |
| JP | 2004127958 A | 4/2004 |
| JP | 200579528 A | 3/2005 |
| JP | 2005064269 A | 3/2005 |
| JP | 2005530343 A | 10/2005 |
| JP | 2005333015 A | 12/2005 |
| JP | 2006526125 A | 11/2006 |
| JP | 2007524229 A | 8/2007 |
| JP | 2007242791 A | 9/2007 |
| JP | 2008073611 A | 4/2008 |
| JP | 2008118118 A | 5/2008 |
| JP | 2008153635 A | 7/2008 |
| JP | 2009-521594 A | 6/2009 |
| JP | 2009129927 A | 6/2009 |
| JP | 2009539231 A | 11/2009 |
| JP | 201080949 A | 4/2010 |
| JP | 2010168607 A | 8/2010 |
| JP | 2010205854 A | 9/2010 |
| JP | 201129394 A | 2/2011 |
| JP | 2011108739 A | 6/2011 |
| JP | 2011258943 A | 12/2011 |
| JP | 2012503883 A | 2/2012 |
| JP | 2012204656 A | 10/2012 |
| JP | 2013105777 A | 5/2013 |
| JP | 2013516788 A | 5/2013 |
| JP | 2013175710 A | 9/2013 |
| JP | 2013179244 A | 9/2013 |
| JP | 2014019912 A | 2/2014 |
| JP | 2014103351 A | 6/2014 |
| JP | 2014525143 A | 9/2014 |
| JP | 2015067884 A | 4/2015 |
| JP | 2015086459 A | 5/2015 |
| JP | 2015115394 A | 6/2015 |
| JP | 2015233157 A | 12/2015 |
| KR | 19980063671 A | 10/1998 |
| KR | 10-2001-0051185 A | 6/2001 |
| KR | 20010046452 A | 6/2001 |
| KR | 20010046843 A | 6/2001 |
| KR | 20030052162 A | 6/2003 |
| KR | 100422433 B1 | 7/2004 |
| KR | 10-20040068969 A | 8/2004 |
| KR | 20050121750 A | 12/2005 |
| KR | 100684910 B1 | 2/2007 |
| KR | 20070048821 A | 5/2007 |
| KR | 20070068596 A | 7/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150062545 A | 6/2015 |
| KR | 10-2015-0130370 A | 11/2015 |
| KR | 20150122432 A | 11/2015 |
| KR | 20160044004 A | 4/2016 |
| KR | 20160061437 A | 5/2016 |
| TW | 200529284 A | 9/2005 |
| TW | 200721316 A | 6/2007 |
| TW | 201507174 A | 2/2015 |
| TW | 201515219 A | 4/2015 |
| TW | 201539550 A | 10/2015 |
| TW | 201608672 A | 3/2016 |
| TW | 201708597 A | 3/2017 |
| TW | 201903197 A | 1/2019 |
| WO | 200051938 A1 | 9/2000 |
| WO | 03023827 A1 | 3/2003 |
| WO | 2004102055 A1 | 11/2004 |
| WO | 2005057663 A2 | 6/2005 |
| WO | 2008047886 A1 | 4/2008 |
| WO | 2008089178 A2 | 7/2008 |
| WO | 2010115128 A3 | 1/2011 |
| WO | 2011002058 A1 | 1/2011 |
| WO | 2011103062 A2 | 8/2011 |
| WO | 2012133583 A1 | 10/2012 |
| WO | 2014115600 A1 | 7/2014 |
| WO | 2015195081 A1 | 12/2015 |
| WO | 2016018593 A1 | 2/2016 |
| WO | 2016065219 A1 | 4/2016 |
| WO | 2016111833 A1 | 7/2016 |
| WO | 2018187546 A1 | 10/2018 |
| WO | 2018/217967 A | 11/2018 |
| WO | 2019/013920 A | 1/2019 |

OTHER PUBLICATIONS

International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.

(56) References Cited

OTHER PUBLICATIONS

Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
Taiwan Office Action dated Oct. 12, 2020 for Application No. 108140559.
Office Action for Japanese Application No. 2019-548976 dated Oct. 20, 2020.
European International Search Report issued to 18764622.9 dated Nov. 20, 2020.
Office Action for Korean Application No. 10-2019-7029776 dated Jan. 18, 2021.
Taiwan Office Action dated May 4, 2020 for Application No. 107121254.
Japanese Office Action dated Feb. 16, 2021 for Application No. 2019-564964.
Extended European International Search Report issued to 18831823.2 dated Mar. 19, 2021.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 dated May 1, 2021.
Office Action for Japanese Patent Application No. 2019-548976 dated May 25, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.
Korean Office Action dated Jul. 16, 2021 for Application No. 10-2020-7007956.
Office Action for Japanese Patent Application No. 2020-543976 dated Jul. 13, 2021.
Taiwan Office Action dated Jul. 28, 2021 for Application No. 107108016.
International Search Report and Written Opinion for International Application No. PCT/US2019/032609 dated Sep. 11, 2019.
Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.
EPO Extended European Search Report dated Aug. 9, 2019, for European Patent Application No. 19166775.7.
Japanese Office Action dated Mar. 17, 2020, for Japanese Patent Application No. 2019-073230.
Taiwan Office Action dated Mar. 31, 2020, for Taiwan Patent Application No. 108111883.
Korean Office Action dated Aug. 4, 2020, for Korean Patent Application No. 10-2019-0040236.
Japanese Office Action dated Nov. 10, 2020, for Japanese Patent Application No. 2019-073230.
T. Miyake et al., "Effects of atomic hydrogen on Cu reflow process", AIP Conferenec Proceedings 418, 419 (1998).
International Search Report and Written Opinion dated Aug. 24, 2017 for Application No. PCT/US2017/033862.
Taiwan Office Action for Application No. 106119184 dated Mar. 6, 2019.
Japanese Office Action for Application No. 2018-564195 dated Nov. 19, 2019.
PCT Notification of Transmittal of the International Search Report and the Written Opinion of the International Searching Authority for International Application No. PCT/US2019/061995; dated Mar. 9, 2020; 13 total pages.
International Search Report PCT/2020/046396 dated Nov. 26, 2020 consists of 12 pages.
Korean Office Action dated Aug. 26, 2021, for Korean Patent Application No. 10-2020-4016526.
Taiwan Office Action for Application No. 110103161 dated Mar. 14, 2023.
Ahn, Byung Du, et al. "A review on the recent developments of solution processes for oxide thin film transistors," Semiconductor Science and Technology, vol. 30, No. 6, May 8, 2015, 15 pages.
European International Search Report issued to 19757893.3. dated Aug. 10, 2021.
European International Search Report issued to 19764212.7 dated Aug. 11, 2021.
Japanese Office Action for Application No. 2020-525886 dated Aug. 31, 2021.
Japanese Office Action for Application No. 2020-547132 dated Nov. 10, 2021.
Japanese Office Action for Application No. 2020-500629 dated Oct. 12, 2021.
Korean Office Action dated Nov. 23, 2021, for Korean Patent Application No. 10-2021-7031756.
Chinese Patent Application No. 201880074319.5, Office Action and Search Report dated Nov. 24, 2021, 14 pages.
KR Office Action dated Nov. 23, 2021, for Korean Patent Application No. 10-2021-7031754.
KR Office Action dated Dec. 14, 2021 for Application No. 10-2020-7027144.
Office Action for Taiwan Application No. 110103161 dated Jun. 28, 2023.
Search Report for Taiwan Application No. 110103161 dated Jun. 26, 2023.
Office Action for Japanese Application No. 2022-549151 dated Jul. 25, 2023.

* cited by examiner

MULTI-STEP PROCESS FOR FLOWABLE GAP-FILL FILM

BACKGROUND

Field

Examples described herein generally relate to the field of semiconductor processing, and more specifically, to performing a multi-step process, e.g., in a same processing chamber, on a flowable gap-fill film on a substrate.

Description of the Related Art

Reliably producing nanometer and smaller features is one of the technology challenges for next generation very large scale integration (VLSI) and ultra large-scale integration (ULSI) of semiconductor devices. As the limits of circuit technology are pushed, the shrinking dimensions of VLSI and ULSI technology have placed additional demands on processing capabilities. As the dimensions of the integrated circuit components are reduced (e.g., in nanometer dimensions), the materials and processes used to fabricate components are generally carefully selected in order to obtain satisfactory levels of electrical performance.

The reduced dimensions of integrated circuit components can lead to increasingly smaller gaps between components. Some processes that may have been suitable for filling similar gaps at larger dimensions may not be suitable to fill gaps at the smaller dimensions. Therefore, there is need for a process and processing system that is able to form complex devices at smaller dimensions while maintaining satisfactory performance of the devices of the integrated circuit.

SUMMARY

Examples include a semiconductor processing system. The semiconductor processing system includes a processing chamber and a system controller. The system controller includes a processor and memory. The memory stores instructions, that when executed by the processor cause the system controller to: control a first process within the processing chamber performed on a substrate having thereon a film deposited by a flowable process, and control a second process within the process chamber performed on the substrate having thereon the film. The first process includes stabilizing bonds in the film to form a stabilized film. The second process includes densifying the stabilized film.

Examples also include a method for semiconductor processing. A substrate having thereon a film deposited by a flowable process is transferred into a processing chamber. A first process is performed, within the processing chamber, on the film on the substrate. The first process includes stabilizing bonds in the film to form a stabilized film. A second process is performed, within the processing chamber, on the film on the substrate. The second process includes comprising densifying the stabilized film.

Examples further include a non-transitory computer-readable storage medium storing instructions that, when executed by a processor, cause a computer system to perform operations. The operations include: controlling a processing system to perform a first process within a processing chamber of the processing system, and controlling the processing system to perform a second process within the process chamber. The first process is performed on a substrate having thereon a film deposited by a flowable process. The first process includes stabilizing bonds in the film to form a stabilized film. The second process is performed on the substrate having thereon the stabilized film. The second process includes comprising densifying the stabilized film.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate some examples and are therefore not to be considered limiting of the scope of this disclosure, for the disclosure may admit to other equally effective examples.

To facilitate understanding, identical reference numerals have been used, wherever possible, to designate identical elements that are common to the figures.

DETAILED DESCRIPTION

Figure 1:
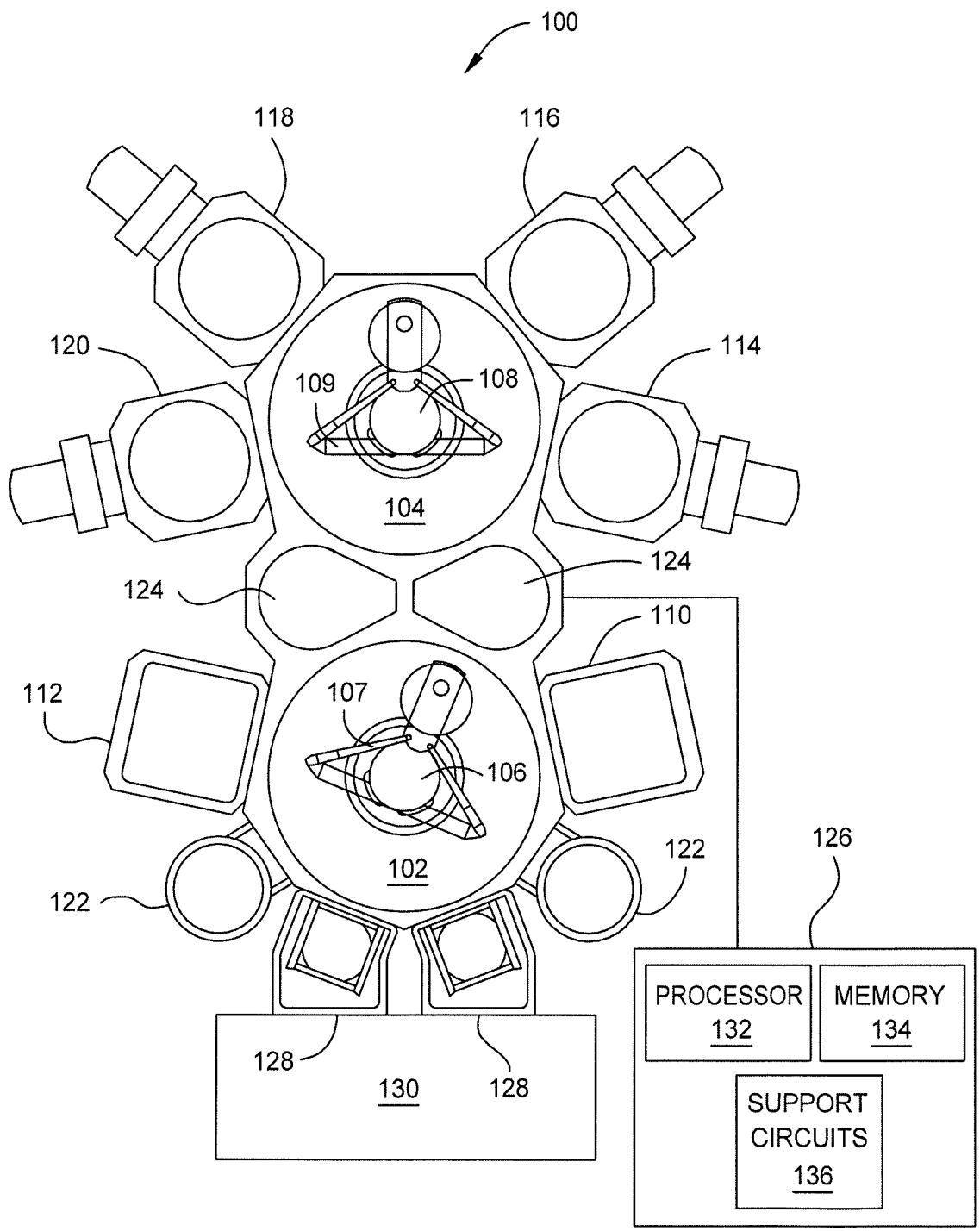
FIG. 1 shows a schematic top view of a multi-chamber processing system according to some examples.

Generally, examples described herein relate to methods and processing systems for performing multiple processes in a same processing chamber on a flowable gap-fill film deposited on a substrate. The multiple process can include stabilizing bonds in a film deposited by a flowable process and subsequently densifying the film.

Performing example processes described herein on a flowable film can improve a quality of the film. Flowable films are commonly used for their ability to flow into gaps, particularly high aspect ratio gaps (e.g., having an aspect ratio of depth to width greater than 10:1). Flowable films generally have a poor quality, including a low density. Previous attempts have been made to increase the quality of flowable films, including processes that implement a hot water dip. These processes were implemented using multiple tools or processing chambers each implementing a different process. Even with these processes, it has been found that the quality of the film can remain poor. For example, a wet etch rate of the film can vary based on the depth of the etch in the film because of non-uniformity of, e.g., density throughout the film. Additionally, the wet etch rate, even varying, can be relatively high, which can cause any deviation of the etch rate to result in a significant difference in result. This can result in differing amounts of the film remaining in gaps. Examples described herein can improve quality of the film, such as improving density of the film. The improved density can achieve a more uniform and lower etch rate that can be more easily controlled and less susceptible to significant differences in results due to deviations from the etch rate. Further, less processing can be performed on the film to achieve such benefits, which can further reduce processing and queue time. Reduced processing and queue time can in turn reduce a cost to manufacture the end product. Additionally, a higher quality film can result in improved electrical characteristics in some applications. These and/or other benefits can be achieved according to various examples.

Various different examples are described below. Some examples are described herein in the context of forming isolation structures (e.g., shallow trench isolations (STIs)) between fins on a substrate. The isolation structures formed by such processing can be implemented in, for example, fin field-effect-transistors (FinFETs). These examples are provided for an understanding of various aspects. Other examples can be implemented in different contexts. For example, some examples can be implemented with any film deposited by a flowable process (e.g., flowable chemical vapor deposition (FCVD) or spin-on) on any underlying structure. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

FIG. 1 shows a schematic top view of a multi-chamber processing system 100 according to some examples. In general, the multi-chamber substrate processing system includes at least one processing chamber that is configured to perform processes with different environments, such as with a high pressure and with a low pressure.

The processing system 100 includes two transfer chambers 102, 104; transfer robots 106, 108 positioned in the transfer chambers 102, 104, respectively; processing chambers 110, 112, 114, 116, 118, 120 disposed coupled to respective ones of the transfer chambers 102, 104; two degas chambers 122 disposed coupled to the first transfer chamber 102; pass-through chambers 124 disposed coupled to each of and between the two transfer chambers 102, 104; and a controller 126. The processing system 100 can further include load lock chambers 128 and a factory interface module 130.

The first transfer chamber 102 is a central vacuum chamber that interfaces with adjacent processing chambers 110, 112, and degas chambers 122. The first transfer chamber 102 is coupled with processing chambers 110, 112, the degas chambers 122, the pass-through chambers 124, and two load lock chambers 128. Each of the processing chambers 110, 112 and degas chambers 122 has an isolation valve disposed between the respective chamber and the first transfer chamber 102. The pass-through chambers 124 and load lock chambers 128 also have respective isolation valves disposed between the respective chamber 124, 128 and the first transfer chamber 102. Each isolation valve permits the respective chamber to be fluidly isolated from and fluidly connected to the first transfer chamber 102. The isolation valve of a chamber allows the respective chamber to operate at, e.g., a different level of pressure than the first transfer chamber 102 and prevents any gases being used in or introduced in the respective chamber from being introduced into the first transfer chamber 102. Each load lock chamber 128 has a door which opens to the outside environment, e.g., opens to the factory interface module 130.

The second transfer chamber 104 is a central vacuum chamber that interfaces with adjacent processing chambers 114, 116, 118, 120. The second transfer chamber 104 is coupled with processing chambers 114, 116, 118, 120 and the pass-through chambers 124. Each of the processing chambers 114, 116, 118, 120 has an isolation valve disposed between the respective chamber and the second transfer chamber 104. The pass-through chambers 124 also have respective isolation valves disposed between the respective chamber 124 and the second transfer chamber 104. Each isolation valve permits the respective chamber to be fluidly isolated from the second transfer chamber 104. The isolation valve of a chamber allows the respective chamber to operate at, e.g., a different level of pressure than the second transfer chamber 104 and prevents any gases being used in or introduced in the respective chamber from being introduced into the second transfer chamber 104.

The first transfer chamber 102 and the second transfer chamber 104 are separated by pass-through chambers 124, which may comprise cooldown or pre-heating chambers. The pass-through chambers 124 also may be pumped down or ventilated during substrate handling when the first transfer chamber 102 and the second transfer chamber 104 operate at different pressures.

While not shown, a gas and pressure control system (e.g., including a plurality of vacuum pumps) is disposed in fluid communication with each transfer chamber 102, 104, each pass-through chamber 124, and each of the processing and degas chambers 110-122 to independently regulate pressures in the respective chambers. The gas and pressure control system can include one or more gas pumps (e.g., turbo pumps, cryo-pumps, roughing pumps, etc.), gas sources, various valves, and conduits fluidly coupled to the various chambers. The gas and pressure control system is capable of maintaining any chamber at a target pressure.

The processing system 100 is automated by a controller 126 that is programmed to control operations, processes, or functions of the processing system 100. The controller 126 can operate individual operations for each of the chambers of the processing system 100 to process a substrate. For example, the controller 126 may control the operation of the processing system 100 using a direct control of the chambers 102-124 of the processing system 100 or by controlling controllers associated with the chambers 102-124. In operation, the controller 126 enables data collection and feedback from the respective chambers to coordinate performance of the processing system 100. The controller 126 generally can include a processor 132 (e.g., a central processing unit (CPU) or other processor), memory 134, and support circuits 136. The processor 132 may be one of any form of a general purpose processor that can be used in an industrial setting. The memory 134 (e.g., a non-transitory computer-readable storage medium) is accessible by the processor and may be one or more of memory such as random access memory (RAM), read only memory (ROM), floppy disk, hard disk, or any other form of digital storage, local or remote. The support circuits 136 can be coupled to the processor and may comprise cache, clock circuits, input/output subsystems, power supplies, and the like. The various methods disclosed herein may generally be implemented under the control of the processor 132 by the processor 132 executing computer instruction code stored in the memory 136 as, e.g., a software routine. When the computer instruction code is executed by the processor 132, the processor 132 controls the chambers to perform processes, and/or controls the processes within the chambers, in accordance with the various methods.

Substrates (not shown) are loaded into the processing system 100 through load lock chambers 128. For example, a factory interface module 130, if present, would be responsible for receiving one or more substrates, e.g., wafers, cassettes of wafers, or enclosed pods of wafers, from either a human operator or an automated substrate handling system. The factory interface module 130 can open the cassettes or pods of substrates, if applicable, and move the substrates to and from the load lock chambers 128. The first transfer chamber 102 receives the substrates from the load lock chambers 128, and the substrates can be transferred throughout the transfer chambers 102, 104, including via the pass-through chambers 124. The various chambers 110-122 receive the substrates from the transfer chambers 102, 104, process the substrates, and allow the substrates to be transferred back into the transfer chambers 102, 104.

In normal operation, a cassette loaded with substrates is placed into the load lock chamber 128 through the door from the factory interface module 130 and the door is closed. The load lock chamber 128 is then evacuated to the same pressure as the first transfer chamber 102 and the isolation valve between the load lock chamber 128 and the first transfer chamber 102 is opened. The transfer robot 106 in the first transfer chamber 102 is moved into position and one substrate is removed from the load lock chamber 128. The load lock chamber 128 is preferably equipped with an elevator mechanism so as one substrate is removed from the cassette, the elevator moves the stack of wafers in the cassette to position another wafer in the transfer plane so that it can be positioned on the robot blade.

The transfer robot 106 in the first transfer chamber 102 then rotates with the substrate so that the substrate is aligned with a processing chamber position. The processing chamber is flushed of any toxic gases, brought to the same pressure level as the transfer chamber, and the isolation valve between the processing chamber and the first transfer chamber 102 is opened. The transfer robot 106 then moves the wafer into the processing chamber where it is lifted off the transfer robot 106. The transfer robot 106 is then retracted from the processing chamber and the isolation valve is closed. The processing chamber then goes through a series of operations to execute a specified process on the wafer. When complete, the processing chamber is brought back to the same environment as the first transfer chamber 102 and the isolation valve is opened. The transfer robot 106 removes the wafer from the processing chamber and then either moves it to another processing chamber for another operation, moves it to the pass-through chamber 124 for transfer to the second transfer chamber 104, or replaces it in the load lock chamber 128 to be removed from the processing system 100 when the entire cassette of wafers has been processed.

If the transfer robot 106 moves the substrate to the pass-through chamber 124, transfer robot 106 in the first transfer chamber 102 rotates with the substrate so that the substrate is aligned with the pass-through chamber 124 position. The pass-through chamber 124 is brought to the same pressure level as the transfer chamber, and the isolation valve between the pass-through chamber 124 and the first transfer chamber 102 is opened. The transfer robot 106 then moves the wafer into the pass-through chamber 124 where it is lifted off the transfer robot 106. The transfer robot 106 is then retracted from the pass-through chamber 124 and the isolation valve is closed. The pass-through chamber 124 then can be brought to the same environment, such as including pressure, as the second transfer chamber 104. When the pass-through chamber 124 is brought back to the same environment as the second transfer chamber 104, the isolation valve between the pass-through chamber 124 and the second transfer chamber 104 is opened. The transfer robot 108 removes the wafer from the pass-through chamber 124, and the isolation valve is closed. The transfer robot 108 then moves the substrate to another processing chamber coupled to the second transfer chamber 104 for another operation. The transfer robot 108 can move the substrate to another processing chamber coupled to the second transfer chamber 104 like described above with respect to the transfer robot 108 moving the substrate to process chamber coupled to the first transfer chamber 102.

The transfer robot 108 can then move the substrate to the pass-through chamber 124 for transfer to the first transfer chamber 102, such as by a reverse sequence of operations by which the substrate was received in the second transfer chamber 104 through the pass-through chamber 124. The transfer robot 106 in the first transfer chamber 102 can move the substrate to another processing chamber for another operation or can replace it in the load lock chamber 128 to be removed from the processing system 100 when the entire cassette of wafers has been processed. The transfer robots 106, 108 include robot arms 107, 109, respectively, that support and move the substrate between different processing chambers.

The processing chambers 110-120 can be or include any appropriate processing chamber. One or more of the processing chambers 110-120 is a chamber configured to perform processing on a substrate using different environments, such as with different pressures, etc., in the chamber. Various examples are described below. Other example processing chambers for the processing chambers 110-120 include a chemical vapor deposition (CVD) chamber, an atomic layer deposition (ALD) chamber, a reactive ion etch (RIE) chamber, a rapid thermal anneal (RTA) or rapid thermal process (RTP) chamber, of the like.

Other processing systems can be in other configurations. For example, more or fewer processing chambers may be coupled to a transfer apparatus. In the illustrated example, a transfer apparatus includes the transfer chambers 102, 104 and pass-through chambers 124. In other examples, fewer or more transfer chambers, pass-through chambers, and/or one or more holding chambers may be implemented as a transfer apparatus in a processing system.

Figure 2:
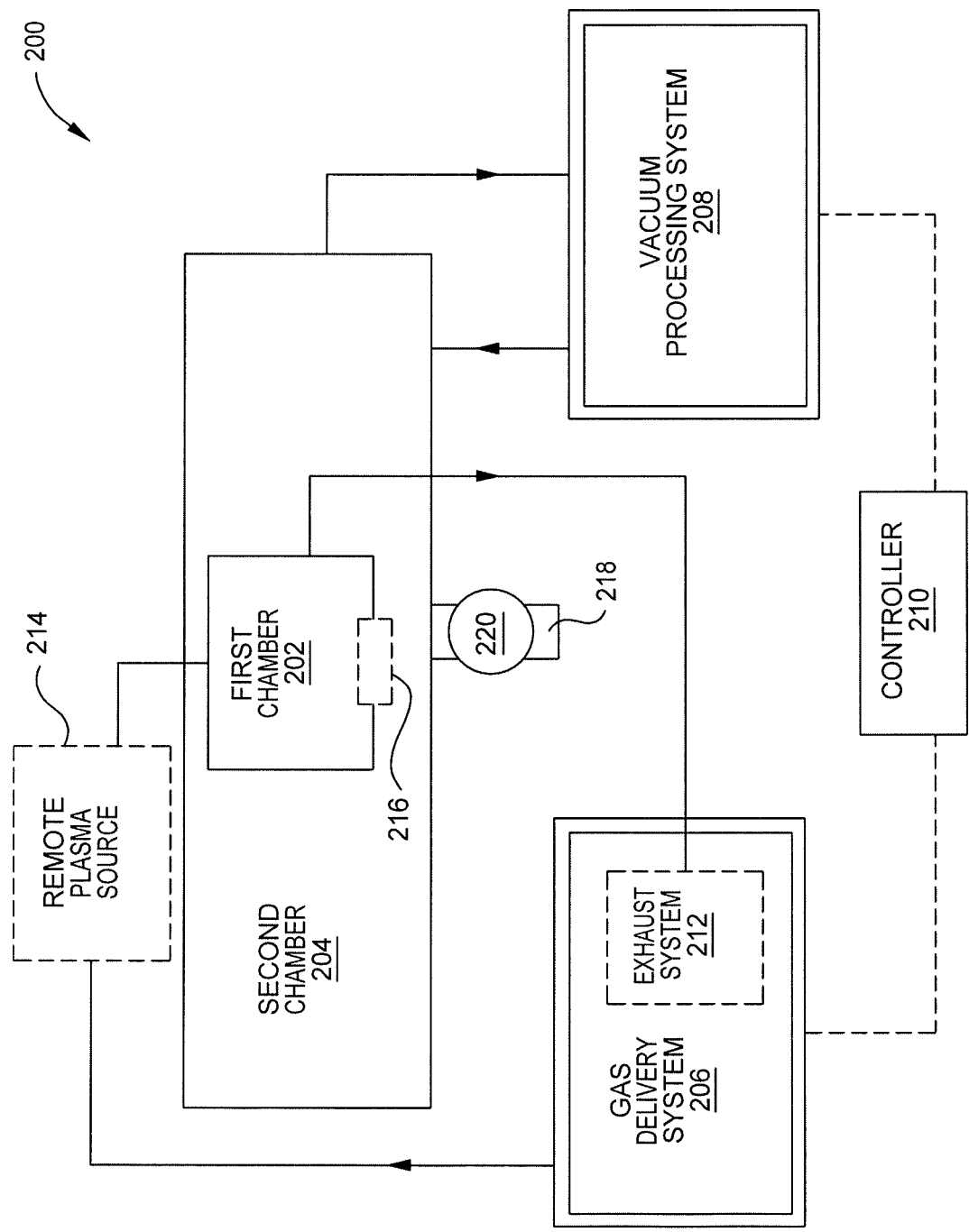
FIG. 2 shows a schematic of a multi-pressure processing chamber that is configured to create a high pressure environment for processing and a low pressure environment for processing according to some examples.

FIG. 2 illustrates a schematic of a multi-pressure processing chamber 200 that is configured to create a high pressure environment for processing a substrate and a low pressure environment for processing the substrate. The multi-pressure processing chamber 200 includes a first chamber 202 and a second chamber 204. The first chamber 202 is disposed within the second chamber 204 and may be considered an inner chamber, and the second chamber 204 may be considered an outer chamber. Further, as apparent from the following description, the first chamber 202 can be configured to enable high pressure processing and may further be considered a high pressure chamber. The first chamber 202 and second chamber 204 may, in some instances, be fluidly coupled together and configured to enable low pressure processing. The pressure within the first chamber 202 can be controlled independently of the pressure in the second chamber 204.

The controlled multi-pressure processing chamber 200 further includes a gas delivery system 206, a vacuum processing system 208, and a controller 210. In some examples, the gas delivery system 206 and the vacuum processing system 208 are at least part of the gas and pressure control system of the processing system 100 of FIG. 1. In some examples, the controller 126 of the processing system 100 can be or include the controller 210.

The gas delivery system 206 is fluidly coupled, e.g., by gas flow conduits, to the first chamber 202 and is operable to pressurize and depressurize the first chamber 202. The first chamber 202 is a high pressure processing chamber that receives a process gas from the gas delivery system 206 and establishes a high pressure, e.g., at a pressure of at least 1 Bar. The process gas can be or include oxygen gas ($O_2$), ozone gas ($O_3$), nitrous oxide ($N_2O$), nitric oxide (NO), steam ($H_2O$), ammonia gas ($NH_3$) the like, or a combination thereof. The gas delivery system 206 can include a combination of a gas panel, conduits, and valves that are controllable, e.g., by the controller 210 to deliver process gases to the first chamber, which may have different process gas compositions for different processes performed in the multi-pressure processing chamber 200. To pressurize the first chamber 202, the gas delivery system 206 introduces the process gas into the first chamber 202. The gas delivery system 206 can include an exhaust system 212 to exhaust the process gas from the first chamber 202, thereby depressurizing the first chamber 202.

In some implementations, the multi-pressure processing chamber 200 includes a remote plasma source (RPS) 214. The RPS 214, in such implementations, is fluidly coupled, e.g., by gas flow conduits, to the gas delivery system 206. The RPS 214 is further fluidly coupled to the first chamber 202. Process gases flowing from the gas delivery system 206 can be ignited in a plasma in the RPS 214. Effluents from the plasma in the RPS 214 can flow into the first chamber 202. The RPS 214 can be a capacitively coupled plasma source or inductively coupled plasma source, for example.

The vacuum processing system 208 is fluidly coupled, e.g., by gas flow conduits, to the second chamber 204 and is operable to control the pressure of the second chamber 204 to be at low pressure, such as at a vacuum or near-vacuum pressure. The low pressure can be, e.g., as low as 10 milliTorr. For example, the vacuum processing system 208 lowers a pressure within the second chamber 204 to near vacuum, thereby creating the appropriate low pressure environment for processing a substrate.

A valve assembly 216 is disposed between the first chamber 202 and the second chamber 204 and is configured to isolate the pressure within the first chamber 202 from the pressure within the second chamber 204. The high pressure environment within the first chamber 202 can thus be separated and sealed from the environment within the second chamber 204. The valve assembly 216 is openable to fluidly connect the first chamber 202 to the second chamber 204 and/or to enable the substrate to be transferred from the multi-pressure processing chamber 200.

In some implementations, the multi-pressure processing chamber 200 includes a foreline 218 connected to the multi-pressure processing chamber 200, and connected to an outside environment. An isolation valve 220 is arranged along the foreline 218 to isolate the pressure within the second chamber 204 from the pressure of the outside environment. The isolation valve 220 can be operated to adjust the pressure within the second chamber 204 and to release gases within the second chamber 204. The isolation valve 220 can be operated in conjunction with the vacuum processing system 208 to regulate the pressure within the second chamber 204.

Generally, a substrate can be processed by multiple processes while disposed within the first chamber 202 within the multi-pressure processing chamber 200. For example, the substrate can be transferred to a pedestal (not shown) within the first chamber 202. The transfer of the substrate into the first chamber 202 can be through the valve assembly 216 in some examples. With the substrate disposed on the pedestal in the first chamber 202, the valve assembly 216 can remain open fluidly coupling the inner volume of the first chamber 202 with the inner volume of the second chamber 204. The vacuum processing system 208 can therefore pump down the pressure within the first chamber 202 and the second chamber 204 while the valve assembly 216 is open. Low pressure processing can therefore be performed on the substrate while the substrate is disposed on the pedestal in the first chamber 202. The low pressure processing can include flowing a process gas from the gas delivery system 206 into the first chamber 202, which can be evacuated by the vacuum processing system 208. In some examples, the low pressure processing can include using a plasma ignited in the RPS 214.

Additionally, with the substrate disposed on the pedestal in the first chamber 202, the valve assembly 216 can be closed to fluidly isolate the inner volume of the first chamber 202 from the inner volume of the second chamber 204. The gas delivery system 206 can create a high pressure within the first chamber 202 with the valve assembly 216 closed. High pressure processing can therefore be performed on the substrate while the substrate is disposed on the pedestal in the first chamber 202. The high pressure processing can include flowing a process gas from the gas delivery system 206 into the first chamber 202. In some examples, the high pressure processing can include using a plasma ignited in the RPS 214.

FIGS. 3 through 6 depict various examples of multi-pressure processing chambers for processing a substrate. The pressure of chambers of these multi-pressure processing chambers can be controlled using systems similar to those described with respect to FIG. 2.

Figure 3:
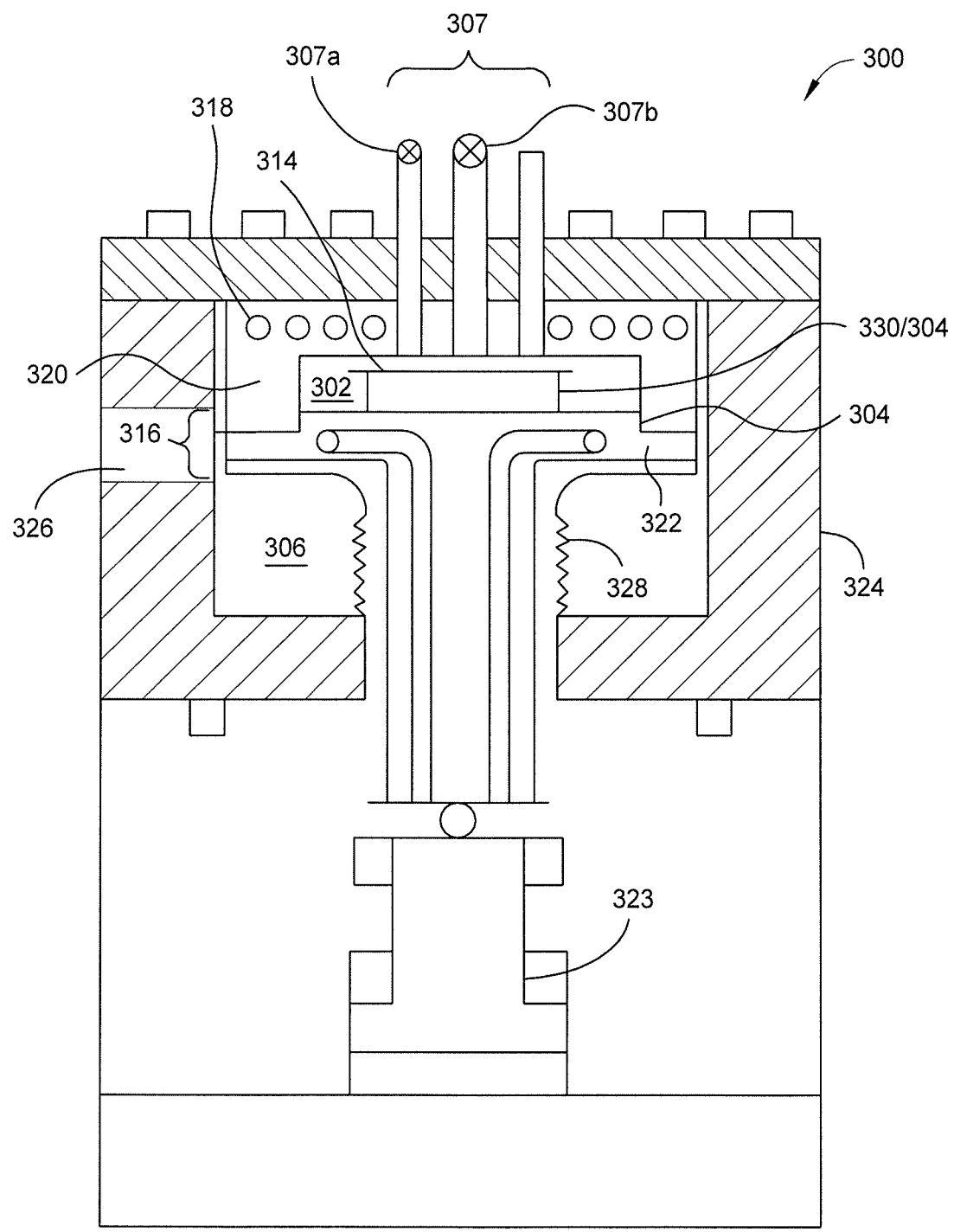
FIGS. 3, 4, 5, and 6 show respective examples of a multi-pressure processing chamber according to some examples.

Referring to FIG. 3, a multi-pressure processing chamber 300 includes a first chamber 302, a pedestal 304, a second chamber 306, and a controller (e.g., the controller 126). As apparent from the following description, the first chamber 302 is disposed within the second chamber 306 and may be considered an inner chamber, and the second chamber 306 may be considered an outer chamber. Further, as apparent from the following description, the first chamber 302 can be configured to enable high pressure processing and may further be considered a high pressure chamber. The first chamber 302 and second chamber 306 may, in some instances, be fluidly coupled together and configured to enable low pressure processing.

The multi-pressure processing chamber 300 further includes a vacuum processing system (not shown) similar to the vacuum processing system 208 and a gas delivery system 307 similar to the gas delivery system 206 described with respect to FIG. 2. For example, the gas delivery system 307 includes an input line 307a and an exhaust line 307b. The process gas is introduced into the first chamber 302 through the input line 307a, and the process gas is exhausted from the first chamber 302 through the exhaust line 307b. In some examples, the multi-pressure processing chamber 300 can include an RPS, which may be coupled to the input line 307a for flowing plasma effluents from the RPS into the first chamber 302.

The pedestal 304 supports a substrate 314 on which a film is to be processed. The pedestal 304 is positioned or positionable within the first chamber 302. In some implementations, the substrate 314 sits directly on a flat top surface of the pedestal. In some implementations, the substrate 314 sits on pins 330 that project from the pedestal.

The multi-pressure processing chamber 300 includes an inner wall 320, a base 322, and an outer wall 324. The first chamber 302 is provided by a volume within the inner wall 320 and the base 322. The second chamber 306 is provide by a volume within the inner wall 320 and outside the inner wall 320, e.g., between the inner wall 320 and the outer wall 324.

The multi-pressure processing chamber 300 further includes a valve assembly 316 between the first chamber 302 and the second chamber 306 that provides the functionality of the valve assembly 216 of FIG. 2, e.g., it can be operated to isolate the first chamber 302 from the second chamber 306 and to fluidly couple the first chamber 302 and the second chamber 306. For example, the valve assembly 316 includes the inner wall 320, the base 322, and an actuator 323 to move the base 322 relative to the inner wall 320. The actuator 323 can be controlled to drive the base 322 to move vertically, e.g., away from or toward the inner walls 320 defining the first chamber 302. A bellows 328 can be used to seal the second chamber 306 from the external atmosphere while permitting the base 322 to move vertically. The bellows 328 can extend from a bottom of the base 322 to a floor of the second chamber 306 formed by the outer wall 324.

When the valve assembly 316 is in a closed position, the base 322 contacts the inner walls 320 such that a seal is formed between the base 322 and the inner walls 320, thus separating the second chamber 306 from the first chamber 302. The actuator 323 is operated to drive the base 322 toward the inner walls 320 with sufficient force to form the seal. The seal inhibits gas from the first chamber 302 from being exhausted into the second chamber 306.

When the valve assembly 316 is in an open position, the base 322 is spaced apart from the inner walls 320, thereby allowing gas to be conducted between the first chamber 302 and second chamber 306 and also allowing the substrate 314 to be accessed and transferred to another chamber.

Because the pedestal 304 is supported on the base 322, the pedestal 304 is thus also movable relative to the inner walls 320. The pedestal 304 can be moved to enable the substrate 314 to be more easily accessible by the transfer robot. For example, an arm of a transfer robot 106 or 108 (see FIG. 1) can extend through an aperture 326 (e.g., a slit) through the outer wall 324. When the valve assembly 316 is in the open position, the robot arm can pass through the gap between the inner wall 320 and the base 322 to access the substrate 314 on the pedestal 304.

In some implementations, the multi-pressure processing chamber 300 includes one or more heating elements 318 configured to apply heat to the substrate 314. The heat from the heating elements 318 can be sufficient to, e.g., anneal the substrate 314 when the substrate 314 is supported on the pedestal 304 and the process gas (if used) has been introduced into the first chamber 302. The heating elements 318 may be resistive heating elements. The one or more heating elements 318 may be positioned in, e.g., embedded in, the inner walls 320 defining the first chamber 302, such as in a ceiling of the first chamber 302 provided by the inner walls 320. The heating elements 318 are operable to heat the inner wall 320, causing radiative heat to reach the substrate 314. The substrate 314 can be held by the pedestal 304 in close proximity, e.g., 2-10 mm, to the ceiling to improve transmission of heat from the inner wall 320 to the substrate 314.

The one or more heating elements 318 may be arranged in other locations within the multi-pressure processing chamber 300, e.g., within the side walls rather than the ceiling. An example of a heating element 318 includes a discrete heating coil. Instead of or in addition to a heater embedded in the inner wall, a radiative heater, e.g., an infrared lamp, can be positioned outside the first chamber 302 and direct infrared radiation through a window in the inner wall 320. Electrical wires connect an electrical source (not shown), such as a voltage source, to the heating element, and can connect the one or more heating elements 318 to the controller.

The controller is operably connected to the vacuum processing system, the gas delivery system 307, and the valve assembly 316 for controlling operations to process the substrate 314. In some implementations, the controller may also be operably connected to other systems. In some cases, the controller 126 shown in FIG. 1 is or includes the controller of the multi-pressure processing chamber 300.

In processing the substrate 314, the controller can operate the vacuum processing system to depressurize the second chamber 306 to a low pressure to prepare for transfer of the substrate 314 through the second chamber 306. The substrate 314 is moved through the aperture 326 and the second chamber 306 by a transfer robot, e.g., one of the transfer robots 106, 108, while the second chamber 306 is at the low pressure so that contamination of the substrate 314 can be inhibited.

The substrate 314 is transferred onto the pedestal 304 for processing. To transfer the substrate 314 onto the pedestal 304, the controller can operate the valve assembly 316 to open the valve assembly 316 to provide an opening through which the substrate 314 can be transferred into the first chamber 302 and onto the pedestal 304. The controller can operate the transfer robot to carry the substrate 314 into the first chamber 302 and to place the substrate 314 on the pedestal 304.

After the substrate 314 is transferred onto the pedestal 304, the controller can operate the valve assembly to be open for low pressure processing or closed for high pressure processing. Any order of high pressure processing and low pressure processing can be implemented. In some examples, a substrate can be processed by cyclically performing low pressure and high pressure processing.

With the valve assembly 316 closed, the inner volume of the first chamber 302 is isolated from the inner volume of the second chamber 306. With the valve assembly 316 closed, pressures in the first chamber 302 and the second chamber 306 can be set to different values. The controller can operate the gas delivery system 307 to introduce the process gas into the first chamber 302 to pressurize the first chamber 302 and to process the substrate 314. The introduction of the process gas can increase the pressure within the first chamber 302 to, for example, 1 Bar or more. Processing in the first chamber 302 can be at a high pressure. If implemented, plasma effluents can be introduced into the first chamber 302 from an RPS to process the substrate 314 during high pressure processing.

The controller can operate the valve assembly 316 to open the valve assembly 316, thereby having the first chamber 302 and second chamber 306 be in fluid communication with each other. With the valve assembly 316 open, pressures in the first chamber 302 and the second chamber 306 can be equal. The controller can operate the vacuum processing system to bring the first chamber 302 and second chamber 306 to a low pressure to process the substrate 314. The low pressure within the first chamber 302 and second chamber 306 can be, for example, as low as 10 milliTorr. Hence, processing in the first chamber 302 and second chamber 306 can be at a low pressure. The controller can operate the gas delivery system 307 to introduce the process gas into the first chamber 302, which can be evacuated by the vacuum processing system, to process the substrate 314. If implemented, plasma effluents can be introduced into the first chamber 302 from an RPS to process the substrate 314 during low pressure processing.

After high pressure processing in the first chamber 302, the controller can operate the exhaust system of the gas delivery system 307 to depressurize the first chamber 302 before the valve assembly 316 is opened. The pressure can be reduced to a low pressure such that the pressure differential between the first chamber 302 and the second chamber 306 can be minimized.

Additionally, while processing the substrate (e.g., with the valve assembly 316 open or closed and/or at high pressure or at low pressure), the controller can operate the heating elements 318 at the same or different temperatures during different processing. Further, the controller can operate the gas delivery system 307 to flow any appropriate gas during any processing (e.g., high pressure processing or low pressure processing).

When processing the substrate 314 in the multi-pressure processing chamber 300 is complete, the substrate 314 can be removed from the first chamber 302 using the transfer robot. To prepare for transfer of the substrate 314 out of the first chamber 302, the controller can operate the exhaust system of the gas delivery system 307 to depressurize the first chamber 302, if appropriate, before the valve assembly 316 is opened. In particular, before the substrate 314 is transferred out of the first chamber 302, the process gas can be exhausted from the first chamber 302 to reduce the pressure within the first chamber 302.

To enable the substrate 314 to be transferred out of the first chamber 302, the controller can open the valve assembly 316. The opened valve assembly 316 provides an opening through which the substrate 314 is moved to be transferred into the second chamber 306 and through the aperture 326. In particular, the opened valve assembly 316 enables the substrate 314 to be transferred directly into the second chamber 306, e.g., into the low pressure environment of the second chamber 306. The controller can then operate the transfer robot to transfer the substrate 314 to another chamber of a processing system, e.g., the processing system 100. For example, the substrate 314 is transferred to the appropriate processing chamber for further processing or to the load lock chamber to remove the substrate from the processing system.

Figure 4:
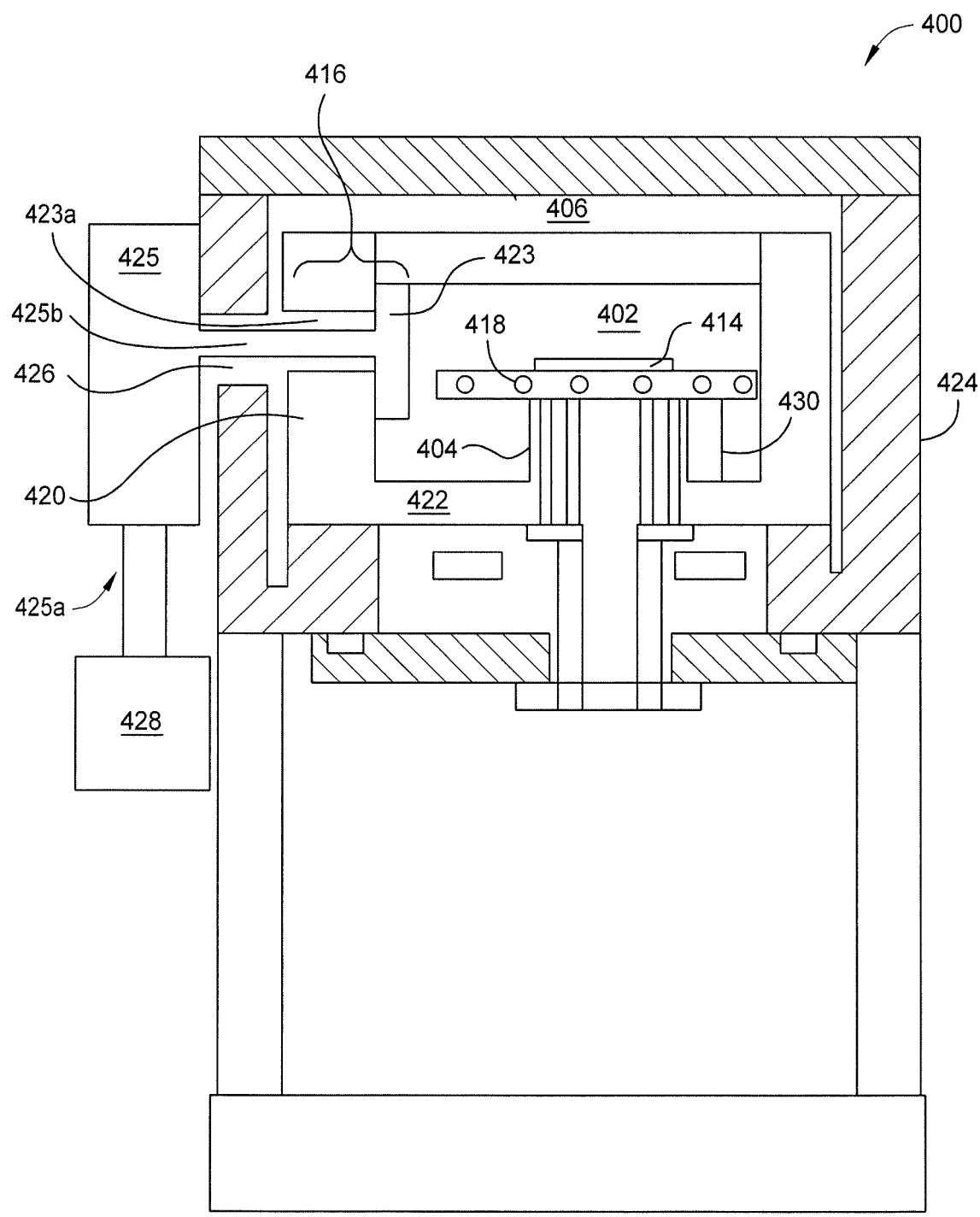

Referring to FIG. 4, in another example, a multi-pressure processing chamber 400 includes a first chamber 402, a pedestal 404, a second chamber 406, and a controller (not shown). The first chamber 402 is disposed within the second chamber 406 and may be considered an inner chamber, and the second chamber 406 may be considered an outer chamber. Further, the first chamber 402 can be configured to enable high pressure processing and may further be considered a high pressure chamber. The first chamber 402 and second chamber 406 may, in some instances, be fluidly coupled together and configured to enable low pressure processing. The multi-pressure processing chamber 400 is similar to the multi-pressure processing chamber 300 described with respect to FIG. 3; unless otherwise specified the various options and implementations are also applicable to the example of FIG. 4.

For example, the gas delivery system and the vacuum processing system of the multi-pressure processing chamber 400 are operated in a similar manner to maintain the low and high pressure environments for a substrate 414 processed using the multi-pressure processing chamber 400. The second chamber 406 can be defined by volume between inner walls 420 and outer walls 424. In addition, the substrate 414 is also supportable on the pedestal 404 for processing within the first chamber 402. Again, the substrate 414 can sit directly on the pedestal 404, or sit on lift pins 430 that extend through the pedestal.

The multi-pressure processing chamber 400 differs from the multi-pressure processing chamber 300 of FIG. 3 in a few regards. First, inner walls 420 defining the first chamber 402 are not movable relative to a base 422 defining the first chamber 402. The pedestal 404 is thus fixed relative to the inner walls 420 and the base 422. In some examples, the pedestal 404 is fixed to the base 422 defining the first chamber 402.

Rather than being arranged in the inner walls 420 of the first chamber 402, as is the case for the one or more heating elements 318 of the example of FIG. 3, one or more heating elements 418 of the example depicted in FIG. 4 are arranged within the pedestal 404. The substrate 414 may thus be heated through contact with the pedestal 404.

The multi-pressure processing chamber 400 further includes a valve assembly 416 between the first chamber 402 and the second chamber 406 that, similar to the valve assembly 316 of FIG. 3, isolates the first chamber 402 from the second chamber 406. However, in contrast to the valve assembly 316, the valve assembly 416 is not formed by the inner walls 420 and the base 422 defining the first chamber 402, but rather includes an arm assembly 425 that has one or more components that are movable relative to the inner walls 420 of the first chamber 402.

In particular, the valve assembly 416 includes the arm assembly 425 and a valve door 423 configured to isolate and fluidly connect the first chamber 402 and the second chamber 406. An aperture 423a is through an inner wall 420 and is between the first chamber 402 and the second chamber 406. An arm 425b of the arm assembly 425 is positioned in the aperture 423a through the inner wall 420 while the valve door 423 is positioned within the first chamber 402. The valve door 423 is connected to the arm 425b at a position distal from the remainder of the arm assembly 425. As illustrated, the arm 425b further extends through an aperture 426 through an outer wall 424, and the remainder of the arm assembly 425 is positioned outside of the second chamber 406. The arm assembly 425 is driven by an actuator 428, which is connected to a drive shaft 425a of the arm assembly 425, that is also positioned outside of the second chamber 406. Movement of the drive shaft 425a, which is driven by the actuator 428, is translated by the arm assembly 425 into movement of the arm 425b. In other examples, the arm assembly 425 (e.g., including the drive shaft 425a) and the actuator 428 can be positioned within the second chamber 406.

The arm assembly 425 extends through the aperture 423a and is movable relative to the inner walls 420 so that the valve door 423 can be moved to a position in which it forms a seal with the inner walls 420. The actuator 428 drives the drive shaft 425a of the arm assembly 425, which translates the driving of the drive shaft 425a into movement of the arm 425b relative to the inner walls 420 and in a general direction that the aperture 423a extends through the inner wall 420. Movement of the arm 425b in this direction can cause the valve door 423 to engage the inner wall 420 (e.g., when the arm 425b is retracted) to thereby form a seal with the inner wall 420 and isolate the first chamber 402 from the second chamber 406, and can cause the valve door 423 to become displaced from the inner wall 420 (e.g., when the arm 425b is extended) to thereby fluidly connect the first chamber 402 and the second chamber 406 In particular, the valve door 423 can be or include a flange from the arm 425b that extends substantially parallel to the adjacent inner surface of the inner wall 420.

Like the valve assembly 316, the valve assembly 416 is movable between an open position and a closed position. When the valve assembly 416 is in the closed position, the arm 425b of the arm assembly 425 is retracted laterally such that the valve door 423 covers the aperture 423a and contacts one of the inner walls 420, thereby forming the seal to isolate the first chamber 402 from the second chamber 406. In particular, the arm 425b of the arm assembly 425 causes the valve door 423 (e.g., the flange) to contact an inner surface of the inner wall 420 defining the first chamber 402.

When the valve assembly 416 is in the open position, the arm 425b of the arm assembly 425 is extended laterally such that the valve door 423 is spaced laterally apart from the inner wall 420, e.g., the inner surface of the inner wall 420. The aperture 423a thus provides an opening that enables fluid communication between the first chamber 402 and the second chamber 406.

The controller can operate the multi-pressure processing chamber 400 in a manner similar to the process described with respect to the controller of the multi-pressure processing chamber 300 to transfer the substrate 414 into and out of the first chamber 402 and to process the substrate 414. In this process, to open and close the valve assembly 416, the controller can operate the actuator 428 to drive the arm assembly 425.

Figure 5:
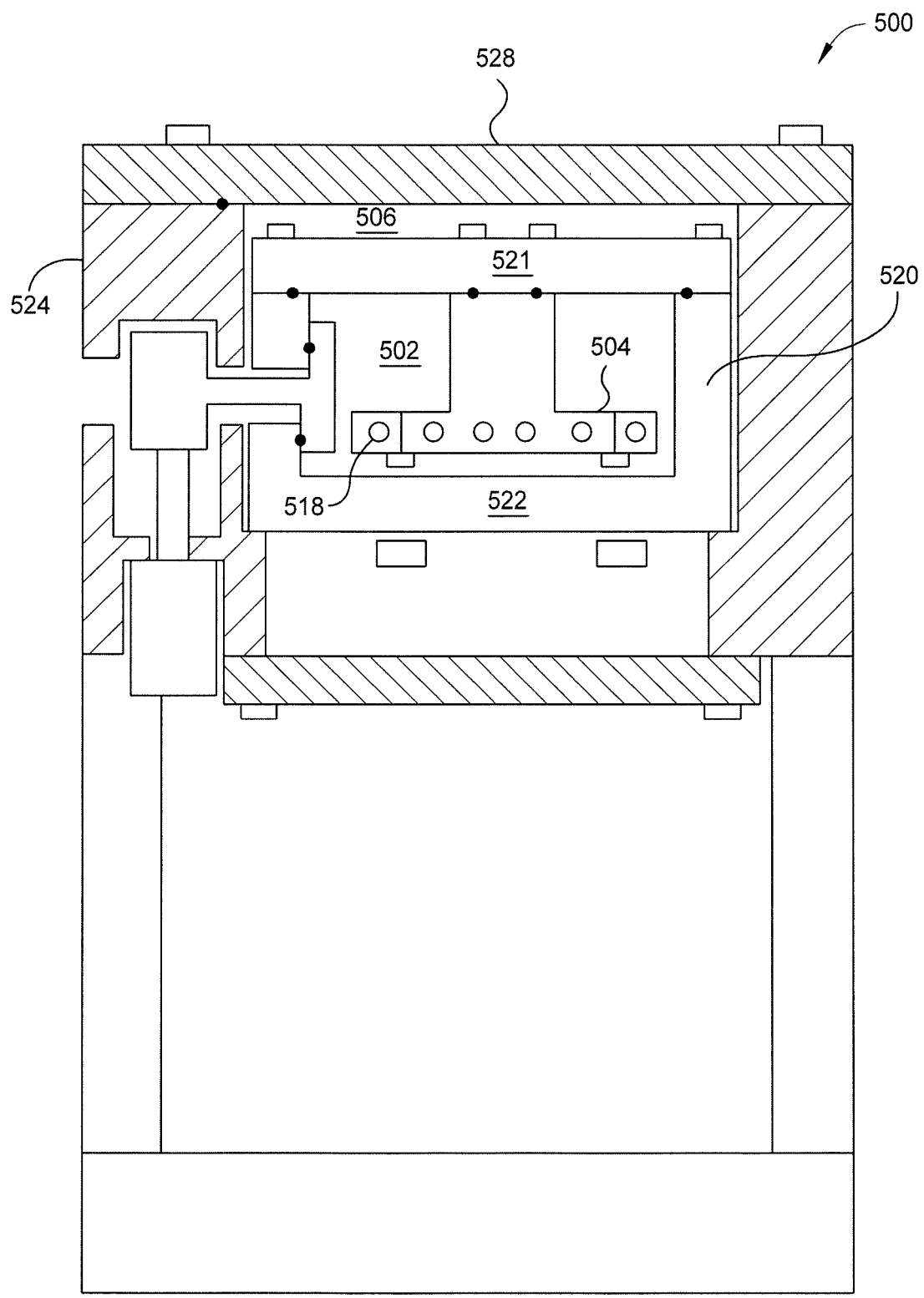

Referring to FIG. 5, in a further example, a multi-pressure processing chamber 500 includes a first chamber 502, a pedestal 504, a second chamber 506, and a controller (not shown). The multi-pressure processing chamber 500 is similar to the multi-pressure processing chamber 400 described with respect to FIG. 4; unless otherwise specified the various options and implementations are also applicable to this example.

For example, the gas delivery system and the vacuum processing system of the multi-pressure processing chamber 500 are operated in a similar manner to maintain the low and high pressure environments for a substrate (not shown) processed using the multi-pressure processing chamber 500. In addition, the substrate is also supportable on the pedestal 504 or lift pins for processing within the first chamber 502.

The multi-pressure processing chamber 500 differs from the multi-pressure processing chamber 400 of FIG. 4 in that the pedestal 504 is mounted to a ceiling 521 defining the first chamber 502 rather than to a base 522 defining the first chamber 502. Like the pedestal 504, the pedestal 504 is fixed relative to the walls 520, the ceiling 521, and the base 522. In addition, one or more heating elements 518 of the multi-pressure processing chamber 500 are arranged within the pedestal 504. To position the substrate on the pedestal 504 such that the substrate is supported on the pedestal 504, the substrate is inserted between plates of the pedestal 504. The one or more heating elements 518 are arranged relative to the plates such that, when the substrate is inserted into a slot defined by the plates of the pedestal 504, the one or more heating elements 518 can uniformly apply heat to the substrate.

Figure 6:
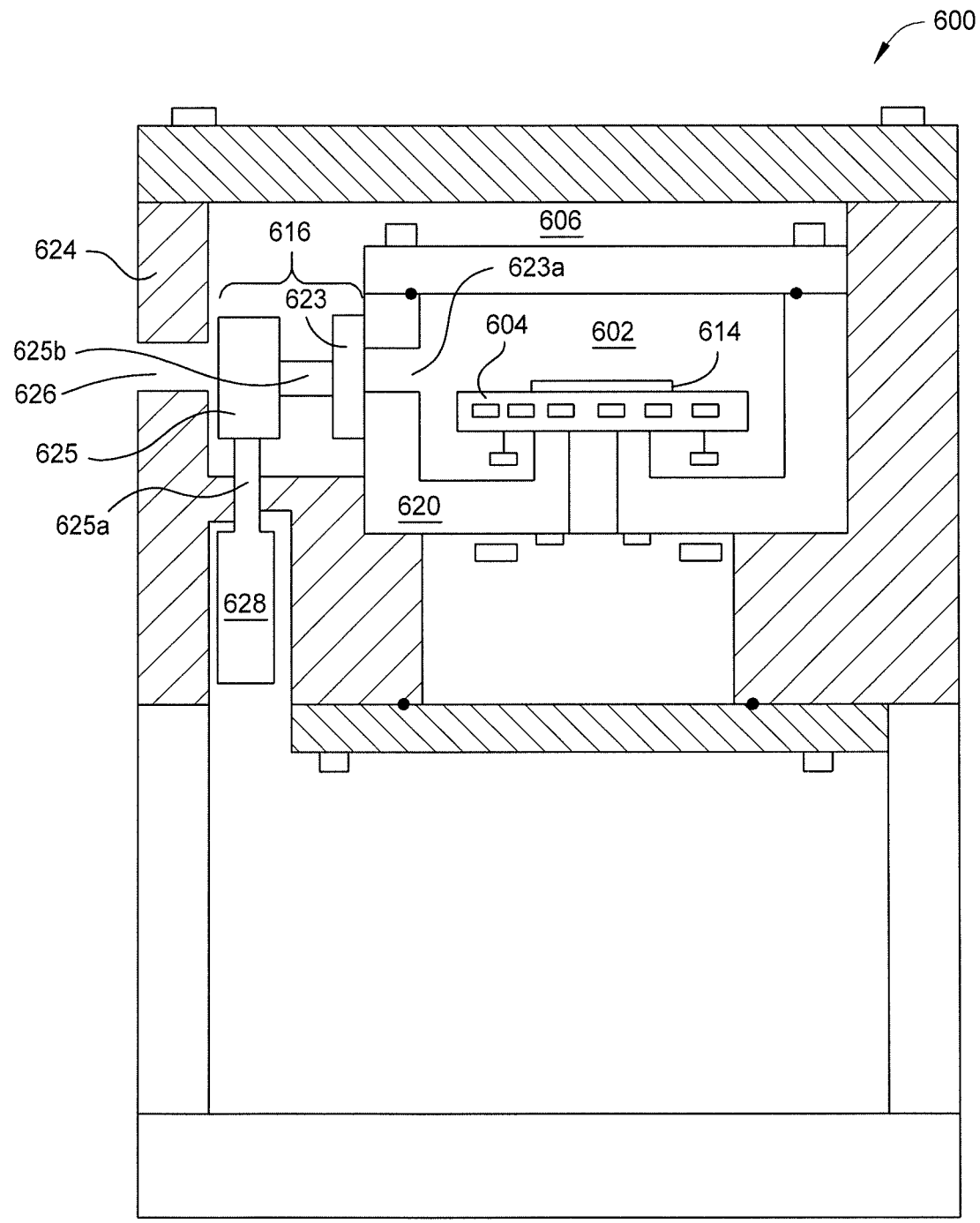

Referring to FIG. 6, in a further example, a multi-pressure processing chamber 600 includes a first chamber 602, a pedestal 604, a second chamber 606, and a controller (not shown). The multi-pressure processing chamber 600 is similar to the multi-pressure processing chamber 400 described with respect to FIG. 4; unless otherwise specified the various options and implementations are also applicable to this example.

For example, the gas delivery system and the vacuum processing system of the multi-pressure processing chamber 600 are operated in a similar manner to maintain the low and high pressure environments for a substrate 614 processed using the multi-pressure processing chamber 600. In addition, the substrate 614 is also supportable on the pedestal 604 for processing within the first chamber 602.

The multi-pressure processing chamber 600 differs from the multi-pressure processing chamber 400 of FIG. 4 in that a valve door 623 of a valve assembly 616 of the multi-pressure processing chamber 600 contacts an outer surface of an inner wall 620 defining the first chamber 602, rather than an inner surface of the inner wall 620, to cover an aperture 623a in the inner wall 620. Like the valve assembly 416, the valve assembly 616 operates to isolate the first chamber 602 from the second chamber 606. The valve assembly 616 can be positioned between the first chamber 602 and the second chamber 606.

The valve assembly 616 includes an arm assembly 625 and a valve door 623 disposed in the second chamber 606. An aperture 623a is through an inner wall 620 and is between the first chamber 602 and the second chamber 606. The valve door 623 is positioned outside of the first chamber 602. The arm assembly 625 is positioned outside of the first chamber 602 and within the second chamber 606. The arm assembly 625 does not extend through the slit 626.

An arm 625b of the arm assembly 625 is movable relative to the inner walls 620 so that the valve door 623 can be moved to a position in which it forms a seal with the inner walls 620. For example, the multi-pressure processing chamber 600 includes an actuator 628 operable to drive the arm assembly 625. The actuator 628 is coupled to the drive shaft 625a of the arm assembly 625, which is configured to drive to move the arm 625b of the arm assembly 625 relative to the inner walls 620.

Like the valve assembly 316, the valve assembly 616 is movable between an open position and a closed position. For example, when the valve assembly 616 is in the closed position, the arm 625b of the arm assembly 625 is laterally extended such that the valve door 623 contacts the inner wall 620 covering the aperture 623a, thereby forming the seal to isolate the first chamber 602 from the second chamber 606.

When the valve assembly 616 is in the open position, the arm 625b of the arm assembly 625 is laterally retracted such that the valve door 623 does not contact the inner wall 620 uncovering the aperture 623a. The aperture 623a thus provides an opening that enables fluid communication between the first chamber 602 and the second chamber 606.

The controller can operate the multi-pressure processing chamber 600 in a manner similar to the process described with respect to the controller of the multi-pressure processing chamber 300. In this process, to open and close the valve assembly 616, the controller can operate the actuator 628 to drive arm 625b of the arm assembly 625.

Figure 7:
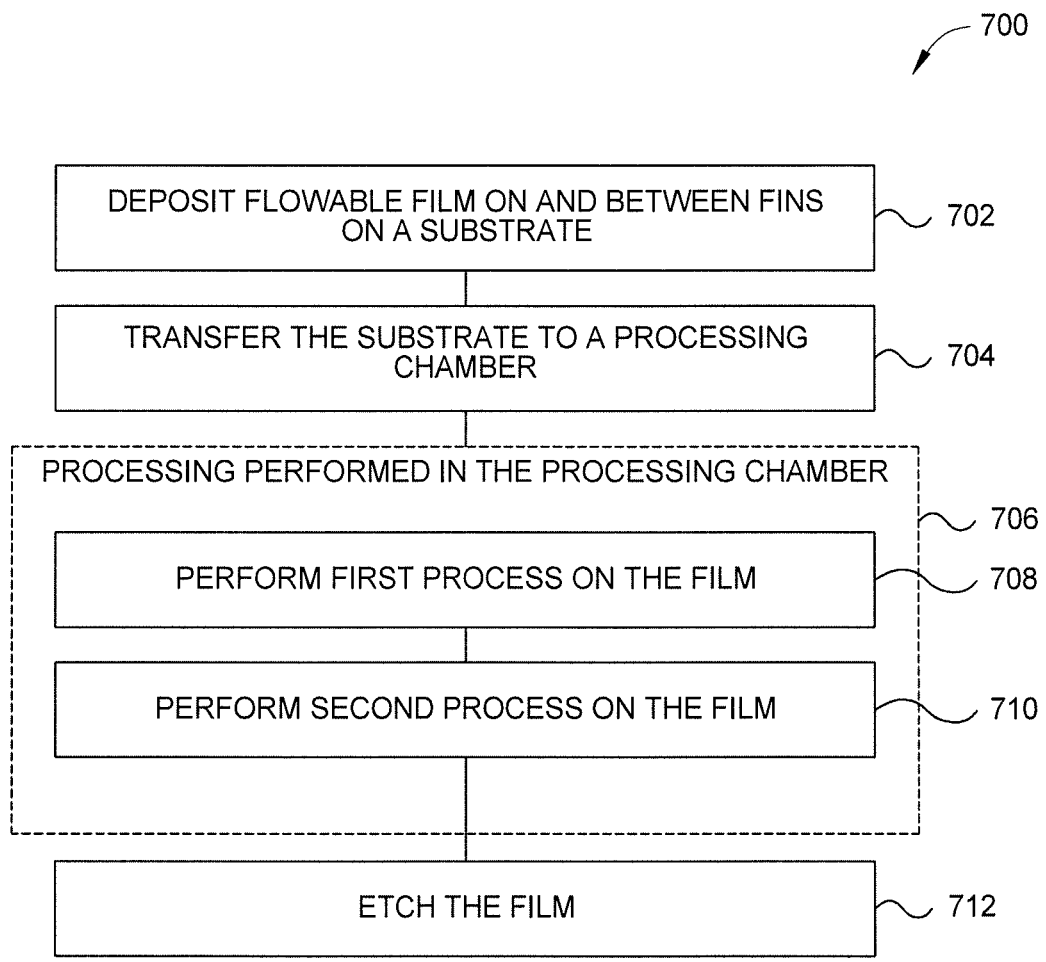
FIG. 7 is a flowchart of a method for semiconductor processing according to some examples.
Figure 8:
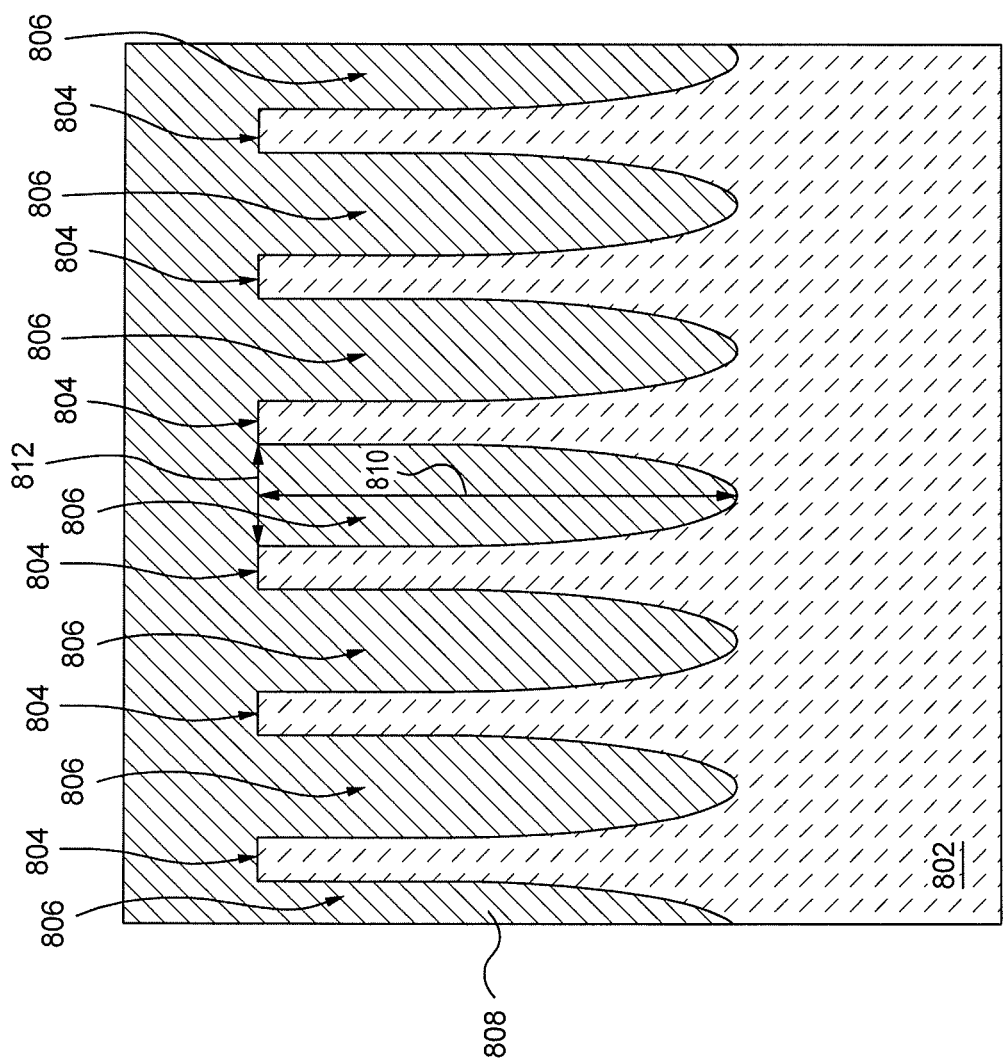
FIGS. 8, 9, and 10 are cross-sectional views of intermediate semiconductor structures illustrating aspects of the method of FIG. 7 according to some examples.
Figure 9:
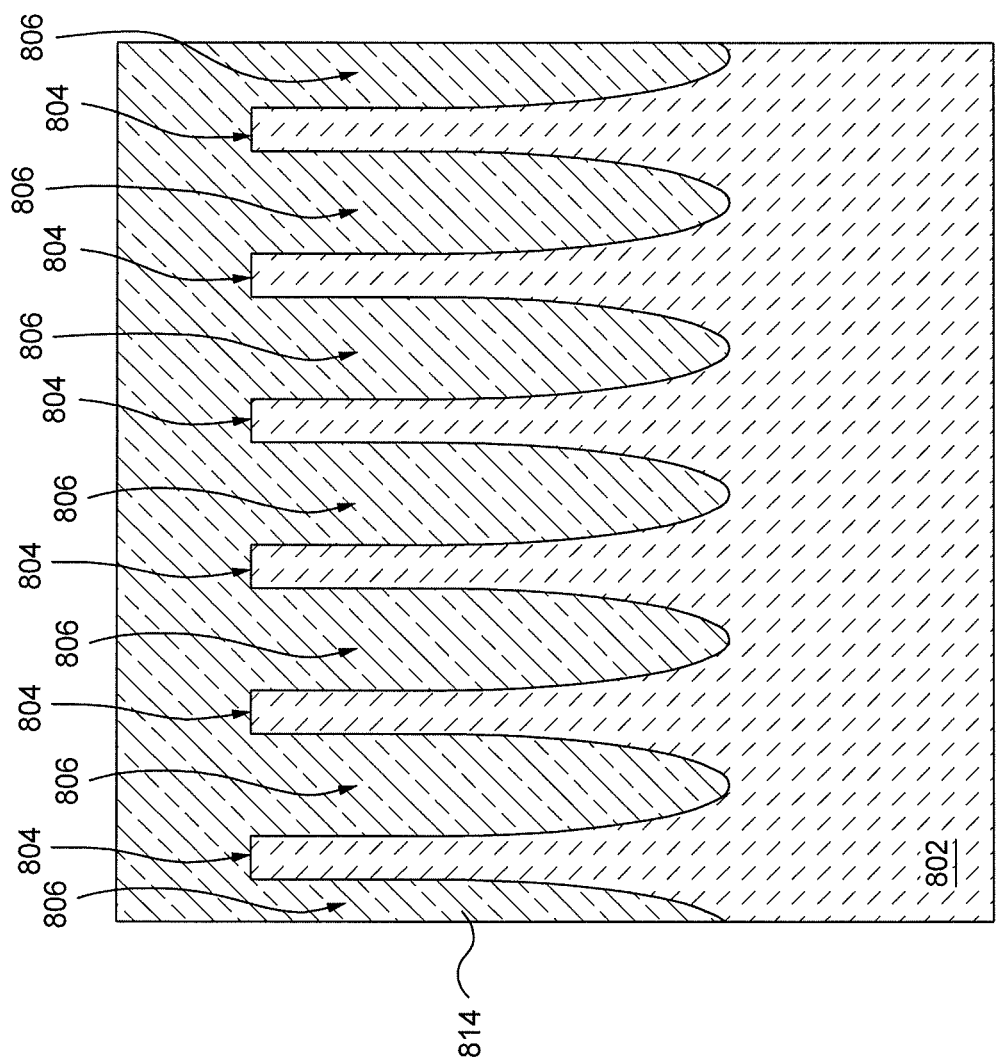
Figure 10:
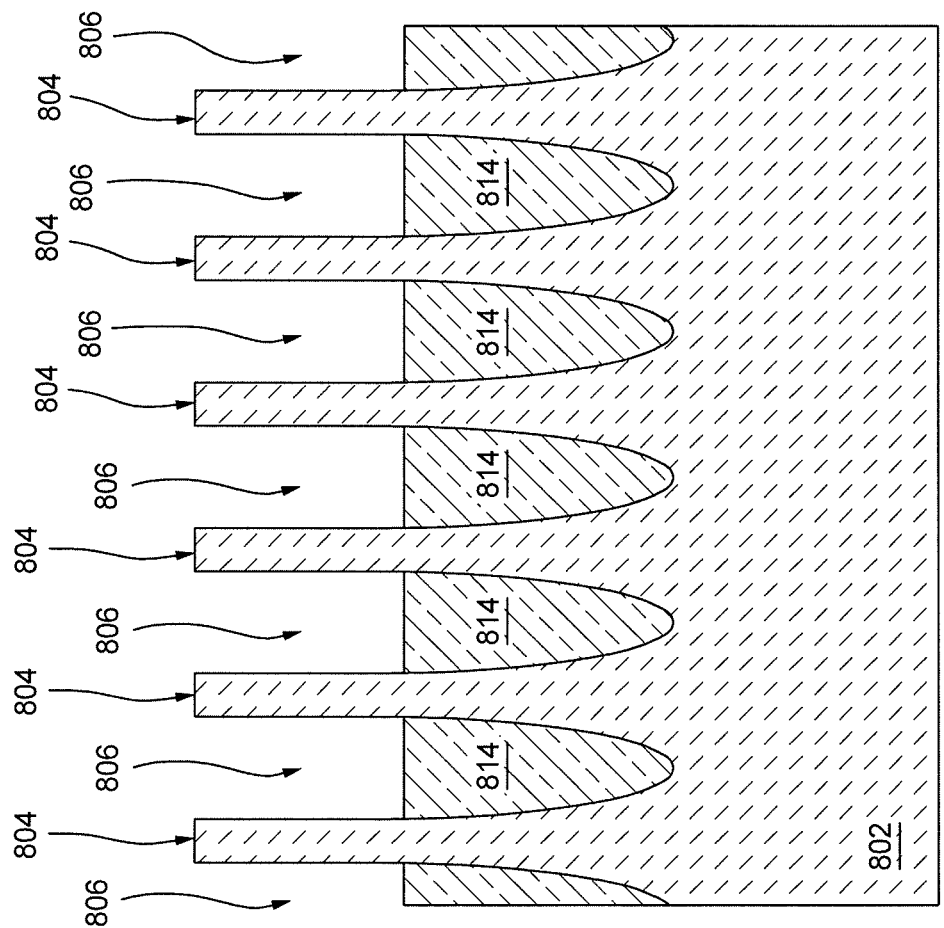

FIG. 7 is a flowchart of a method 700 for semiconductor processing according to some examples. FIGS. 8 through 10 are cross-sectional views of intermediate semiconductor structures illustrating aspects of the method 700 of FIG. 7 according to some examples. Examples described herein are in the context of forming isolation structures (e.g., shallow trench isolations (STIs)) between fins on a substrate. A person having ordinary skill in the art will readily understand various applications of aspects described herein to other contexts, and such variations are contemplated within the scope of other examples.

According to block 702 of FIG. 7, a flowable film is deposited on and between fins on a substrate. FIG. 8 illustrates a cross-sectional view of a flowable film 808 deposited on and between fins 804 on a substrate 802. To obtain the structure of FIG. 8, a substrate 802 is provided. The substrate 802 can be any appropriate semiconductor substrate, such as a bulk substrate, semiconductor-on-insulator (SOI) substrate, or the like. In some examples, the substrate 802 is a bulk silicon wafer. Examples of substrate sizes include 200 mm diameter, 350 mm diameter, 400 mm diameter, and 450 mm diameter, among others. Fins 804 are then formed on the substrate 802. The fins 804 can be formed by etching features, such as trenches 806 that extend into the substrate 802 such that each fin 804 is defined between a neighboring pair of features (e.g., trenches 806). Any appropriate patterning process can be implemented to form the features. The patterning process can include a multiple patterning process, such as self-aligned double patterning (SADP), lithography-etch-lithography-etch (LELE) double patterning, etc., to achieve a target pitch between fins 804. An example etch process to etch the trenches 806 includes a reactive ion etch (RIE) process or the like. Each trench 806 can have or form a high aspect ratio. The aspect ratio can be a ratio of the depth 810 of the trench 806 to the width 812 of the trench 806. An aspect ratio can be 10:1 or more. In some examples, one or more layers, such as a diffusion barrier layer, are formed on the fins 804, and the depth 810 and width 812 can be measured from an outer surface of the outermost layer.

The flowable film 808 is then deposited in the trenches 806 and on the fins 804. The flowable film 808 can be deposited by a FCVD process or spin-on, in some examples. For example, in a FCVD process, a flowable film 808 can be a silicon based dielectric that includes a high concentration of nitrogen and/or hydrogen. For example, in a FCVD process, precursors can be or include silyl-amines, such as $H_2N(SiH_3)$, $HN(SiH_3)_2$, and $N(SiH_3)_3$, silane ($SiH_4$), or other similar precursors, which may be mixed with other gases, such as trisilylamine ($N(SiH_3)_3$), hydrogen ($H_2$), nitrogen ($N_2$), and/or ammonia ($NH_3$). The flowability of the flowable film 808 can permit the flowable film 808 to provide good gap filling, such as in high aspect ratio gaps (e.g., which may be formed by the trenches 806).

According to block 704, the substrate 802 having the flowable film 808 deposited thereon is then transferred to a processing chamber. The processing chamber is a multi-pressure processing chamber, such as any described above with respect to FIGS. 2 through 7. As example for context herein, the processing chamber of block 704 is the multi-pressure processing chamber 300 of FIG. 3. The processing chamber may be included in a processing system, such as the processing system 100 of FIG. 1.

For example, the substrate 802 is transferred by a front opening unified pod (FOUP) to a factory interface module 130, and at the factory interface module 130, the substrate 802 is transferred from the FOUP to a load lock chamber 128. Subsequent transfers and processing are performed in the processing system 100, e.g., without exposing the substrate 802 to an atmospheric ambient environment outside of the processing system 100 and without breaking a low pressure or vacuum environment maintained within the transfer apparatus of the processing system 100. The transfer robot 106 transfers the substrate 802 from the load lock chamber 128 into the first transfer chamber 102. The substrate 802 can thereafter be transferred to the processing chamber (e.g., multi-pressure processing chamber 300) by the transfer robot 106 if the multi-pressure processing chamber 300 is coupled to the first transfer chamber 102, or to a pass-through chamber 124 by the transfer robot 106 and subsequently from the pass-through chamber 124 to the multi-pressure processing chamber 300 by the transfer robot 108 if the multi-pressure processing chamber 300 is coupled to the second transfer chamber 104. In some examples, the deposition of the flowable film 808 can be in a processing chamber within the processing system. Hence, in such examples, the substrate 802 can be transferred into the processing system 100 before deposition of the flowable film 808 and can subsequently be transferred within the processing system 100 to the multi-pressure processing chamber 300. The valve assembly 316 of the multi-pressure processing chamber 300 is opened, and the transfer robot of the transfer chamber transfers the substrate 802 onto the pedestal 304, like described above.

According to block 706, processing is performed in the processing chamber, including a first process at block 708 followed by a second process at block 710. The second process at block 710 is different from the first process at block 708. Additional process may be performed in the processing chamber in other examples.

In some examples, the first process at block 708 forms more bonds and/or bonds that are more stable in the flowable film, and the second process at block 710 densifies, and may further create more stable bonds within, the stabilized film. Hence, the first process at block 708 includes stabilizing the flowable film, and the second process at block 710 includes densifying the stabilized film.

In some examples, the first process at block 708 and the second process at block 710 can be at a same or different pressure. In some examples, the first process at block 708 is at a pressure that is lower than a pressure of the second process at block 710. In some examples, the second process at block 710 is performed at a pressure within the processing chamber that is three orders of magnitude or more (e.g., four orders of magnitude or more) greater than a pressure within the processing chamber at which the first process at block 708 is performed. In some examples, the first process at block 708 is at a pressure that is greater than a pressure of the second process at block 710. As examples, the first process can be performed at a pressure in a range from 10 milliTorr to 100 Bar, and the second process can be performed at a pressure greater than or equal to 1 Bar, such as greater than or equal to 5 Bar.

In some examples, temperatures at which the first process and second process are performed are equal, while in other examples, the temperatures may differ. In some examples, a temperature of the first process at block 708 is less than a temperature of the second process at block 710. As examples, the temperature of the first process at block 708 can be in a range from 300° C. to 1000° C., and the temperature of the process at block 710 can be in a range from 300° C. to 1000° C., which temperature may be equal to, less than, or greater than the temperature of the first process at block 708. As examples, the temperature of the first process at block 708 can be in a range from 100° C. to 300° C., and the temperature of the process at block 710 can be in a range from 300° C. to 1000° C.

In some examples, a process gas composition (e.g., which may be a single gas or a mixture of gases) flowed for the first process at block 708 differs from a process gas composition flowed for the second process at block 710. Examples for the first process and second process are described below.

In some examples, the first process at block 708 is a conversion process in addition to being a stabilization process. The conversion and stabilization process converts the flowable film 808 to have another dielectric composition. For example, the conversion process can convert a silicon based dielectric that includes a high concentration of nitrogen and/or hydrogen deposited by a FCVD process into silicon oxide. The conversion process can be an oxidation process.

In some examples, the oxidation process is a thermal oxidation process or a plasma oxidation process. In a thermal oxidation process, an oxygen-containing process gas, such as oxygen gas ($O_2$), ozone gas ($O_3$), nitrous oxide ($N_2O$), nitric oxide (NO), or a combination thereof, can be flowed in the processing chamber. The oxygen-containing process gas can be continuously flowed into the processing chamber, or can be flowed into the processing chamber until a desired pressure is achieved and ceased, where the pressure is maintained thereafter during the oxidation process. The flow rate of the oxygen-containing process gas can be in a range from about 5 sccm to about 200 slm, for example. During the thermal oxidation process, the pressure within the processing chamber can be maintained at a pressure between 10 milliTorr and 100 Bar. The thermal oxidation process can be performed at a temperature greater than 300° C., such as in a range from about 300° C. to about 1000° C. In a plasma oxidation process, a plasma is ignited in a RPS using an oxygen-containing process gas, such as oxygen gas ($O_2$), ozone gas ($O_3$), nitrous oxide ($N_2O$), nitric oxide (NO), or a combination thereof. Oxygen-containing plasma effluents are flowed in the processing chamber. A RF power source of the RPS can have a frequency in a range from about 2 MHz to about 40 MHz, such as 13.56 MHz, and can have a power in a range from about 50 W to about 3000 W. Flowing of gas, a temperature, and pressure in the plasma oxidation process can be like previously described for the thermal oxidation.

In some examples, the first process at block 708 is a stabilization process that does not significantly affect the composition of the flowable film. For example, the stabilization process can substantially maintain a composition of a silicon based dielectric that includes a high concentration of nitrogen and/or hydrogen deposited by a FCVD process.

In some examples, the stabilization process is a thermal process or a plasma process. In a thermal process, an ammonia-containing process gas, such as ammonia gas ($NH_3$), can be flowed in the processing chamber. The ammonia-containing process gas can be continuously flowed into the processing chamber, or can be flowed into the processing chamber until a desired pressure is achieved and ceased, where the pressure is maintained thereafter during the thermal process. The flow rate of the ammonia-containing process gas can be in a range from about 5 sccm to about 200 slm, for example. During the thermal process, the pressure within the processing chamber can be maintained at a pressure between 10 milliTorr and 100 Bar. The thermal process can be performed at a temperature greater than 300° C., such as in a range from about 300° C. to about 1000° C. In a plasma process, a plasma is ignited in a RPS using an ammonia-containing process gas, such as ammonia gas ($NH_3$). Nitrogen-containing plasma effluents and/or hydrogen-containing plasma effluents are flowed in the processing chamber. A RF power source of the RPS can have a frequency in a range from about 2 MHz to about 40 MHz, such as 13.56 MHz, and can have a power in a range from about 50 W to about 3000 W. Flowing of gas, a temperature, and pressure in the plasma process can be like previously described for the stabilization without a plasma.

The first process at block 708 can be performed in the multi-pressure processing chamber 300 while the valve assembly 316 remains in an open or closed position, e.g., depending on a pressure at which the first process is performed. The valve assembly 316 can remain open for low pressure processing, or can be closed for high pressure processing. The oxygen-containing process gas or ammonia-containing process gas can be flowed through the gas delivery system 307 and evacuated through the second chamber 306 by the vacuum processing system. The heating elements 318 can maintain the temperature in the first chamber 302 during the first process.

In some examples, the second process at block 710 is a densification process. The densification process increases a density of the dielectric material that was stabilized and/or converted from the flowable film 808. For example, the densification process can increases a density of the silicon oxide, which was converted from the silicon based dielectric that included a high concentration of nitrogen and/or hydrogen deposited by a FCVD process. The densification process may additionally further convert the stabilized film to another dielectric composition (e.g., silicon oxide). The densification process can catalyze reactions that form Si—O—Si bonds. The densification process can be an anneal process.

In some examples, the anneal process is a dry anneal process or a steam anneal process. The dry anneal process can be performed at a temperature greater than 300° C., such as in a range from about 300° C. to about 1000° C. In the dry anneal process, a process gas, such as ammonia gas ($NH_3$), nitrous oxide ($N_2O$), nitric oxide (NO), or the like, can be flowed in the processing chamber. The process gas can be continuously flowed into the processing chamber, or can be flowed into the processing chamber until a desired pressure is achieved and ceased, where the pressure is maintained thereafter during the dry anneal process. The flow rate of the process gas can be in a range from about 5 sccm to about 200 slm, for example. The dry anneal process can additionally be an oxidation process to further convert the film when the process gas includes an oxygen-containing gas, such as nitrous oxide ($N_2O$) and/or nitric oxide (NO). During the dry anneal process, the pressure within the processing chamber can be maintained at a high pressure, such as on the order of a Bar, such as about 1 Bar or more, or more specifically, about 5 Bar or more.

The steam anneal process can be performed at a temperature greater than 300° C., such as in a range from about 350° C. to about 1000° C. In the steam anneal process, steam ($H_2O$) with or without another process gas, like ammonia gas ($NH_3$), nitrous oxide ($N_2O$), nitric oxide (NO), or a combination thereof, can be flowed in the processing chamber. The steam with or without a process gas can be continuously flowed into the processing chamber, or can be flowed into the processing chamber until a desired pressure is achieved and ceased, where the pressure is maintained thereafter during the steam anneal process. The flow rate of the steam with or without a process gas can be in a range from about 5 sccm to about 200 slm, for example. The steam anneal process can additionally be an oxidation process to further convert the film. During the steam anneal process, the pressure within the processing chamber can be maintained at a high pressure, such as on the order of a Bar, such as about 1 Bar or more, or more specifically, about 5 Bar or more.

The second process at block 710 can be performed in the multi-pressure processing chamber 300 while the valve assembly 316 is in an open or closed position, e.g., depending on a pressure at which the first process is performed. The process gas (e.g., including steam) can be flowed through the gas delivery system 307, which can establish and maintain the high pressure. The heating elements 318 can maintain the temperature in the first chamber 302 during the second process.

In further examples, the first process at block 708 is a conversion process in addition to a stabilization process. The conversion and stabilization process converts the flowable film 808 to have another dielectric composition, like described above. The conversion process can be an oxidation process. In some examples, the oxidation process is a steam oxidation process or a plasma oxidation process. In a steam oxidation process, steam ($H_2O$) can be flowed in the processing chamber. The steam can be continuously flowed into the processing chamber, or can be flowed into the processing chamber until a desired pressure is achieved and ceased, where the pressure is maintained thereafter during the steam oxidation process. The flow rate of the steam can be in a range from about 5 sccm to about 200 slm, for example. During the steam oxidation process, the pressure within the processing chamber can be maintained at a pressure less than 5 Bar. The pressure during the steam oxidation is less than the pressure of the second process at block 710. The steam process can be performed at a temperature greater than 100° C., such as in a range from about 100° C. to about 300° C. The temperature during the steam oxidation is less than the temperature of the second process at block 710. In a plasma oxidation process, a plasma is ignited in a RPS using steam ($H_2O$). Oxygen-containing plasma effluents and/or hydrogen-containing plasma effluents are flowed in the processing chamber. A RF power source of the RPS can have a frequency in a range from about 2 MHz to about 40 MHz, such as 13.56 MHz, and can have a power in a range from about 50 W to about 3000 W. Flowing of steam, a temperature, and pressure in the plasma oxidation process can be like previously described for the steam oxidation.

Table 1 below summarizes different combinations of processes according to some examples. An example is contained within a respective row in Table 1. Different combinations can be implemented. Additional processes can be performed, such as by repeating the first and second processes.

flowable film 808, on and between fins 804 on the substrate 802. In some examples, the flowable film 808 is converted from a silicon based dielectric that included a high concentration of nitrogen and/or hydrogen into a silicon dioxide, which was densified. In such examples, the converted and densified film 814 is a densified silicon oxide, which is a different material composition from the originally deposited flowable film 808.

According to block 712 of FIG. 7, the film that was processed at block 706 is etched. In some examples, after the processing of block 706, the substrate 802 is removed from the processing chamber by the transfer robot of the transfer chamber to which the processing chamber is coupled. For example, the substrate 802 can be removed from the first chamber 302 of the multi-pressure processing chamber 300 as described above. The substrate 802 can be transferred to another processing chamber within the processing system 100 or to a processing chamber of another processing system. The etch can be by any appropriate etch process. In some examples, the etch process is a wet etch, although a dry etch may also be implemented. Further, the wet etch can use dilute hydrofluoric acid (dHF), which can be selective to silicon oxide. In some examples, a 100:1 dHF solution was implemented to etch a converted and densified film of silicon oxide. The etch rate of the etch of block 706 can be more uniform and lower, which can be more easily controlled, as described above.

FIG. 10 illustrates a cross-sectional view of isolation structures (e.g., STIs) formed with the converted and densified film 814 in trenches 806 between fins 804 on the substrate 802, e.g., after etching the converted and densified film 814. As a result of the etch process, the fins 804 protrude from between neighboring isolation structures. Top surfaces of the isolation structures (e.g., top surface of the converted and densified film 814) can be recessed to any depth from top surfaces of the fins 804, and the illustration of FIG. 10 is merely an example.

The fins 804, with the isolation structures therebetween, can thereafter be used to form any appropriate device structure. For example, the fins 804 can be used to form FinFETs. A gate structure can be formed on and longitudi-

TABLE 1

| | First Process | Second Process |
|---|---|---|
| Ex. (1) | Process gas: $O_2$, $O_3$, $N_2O$, NO, or a combination thereof<br>Pressure: 10 milliTorr to 100 Bar<br>Temperature: 300° C. to 1000° C.<br>Type: Gas or RPS | Process gas: $H_2O$, $NH_3$, $N_2O$, NO, or a combination thereof<br>Pressure: >= 1 Bar<br>Temperature: 300° C. to 1000° C.<br>Type: Gas or RPS |
| Ex. (2) | Process gas: $NH_3$<br>Pressure: 10 milliTorr to 100 Bar<br>Temperature: 300° C. to 1000° C.<br>Type: Gas or RPS | Process gas: $H_2O$, $N_2O$, NO, or a combination thereof, any of which may additionally include $NH_3$<br>Pressure: >= 1 Bar<br>Temperature: 300° C. to 1000° C.<br>Type: Gas or RPS |
| Ex. (3) | Process gas: $H_2O$<br>Pressure: <= 5 Bar<br>Temperature: 100° C. to 300° C.<br>Type: Gas or RPS | Process gas: $H_2O$, $NH_3$, $N_2O$, NO, or a combination thereof<br>Pressure: >= 1 Bar (or >= 5 Bar) [Greater than pressure of First Process]<br>Temperature: 300° C. to 1000° C. [Greater than temperature of First Process]<br>Type: Gas or RPS |

FIG. 9 illustrates a cross-sectional view of a converted and densified film 814, which was converted from the nally perpendicularly to a fin 804. The gate structure can include a gate dielectric (e.g., a high-k gate dielectric) along surfaces of the fin, one or more work-function tuning layers on the gate dielectric, and a metal fill on the work-function tuning layer(s). The gate structure can define a channel region in the respective fin 804 underlying the gate structure. Source/drain regions (e.g., epitaxial source/drain regions) can be formed in the fin on opposing sides of the channel region. The gate structure, channel region, and source/drain regions together can form a FinFET.

While the foregoing is directed to various examples of the present disclosure, other and further examples may be devised without departing from the basic scope thereof, and the scope thereof is determined by the claims that follow.

The invention claimed is:

1. A method for semiconductor processing, the method comprising:
   transferring into a multi pressure processing chamber a substrate having thereon a film deposited by a flowable process; performing a first process at between 10 milliTorr and less than or equal to 1 Bar, within the processing chamber, on the film on the substrate, the first process comprising stabilizing bonds in the film to form a stabilized film, wherein the first process is one of at least a thermal oxidation process, a plasma oxidation process, a stabilizing thermal process, or a stabilizing plasma process performed at a temperature of between about 300° C. and about 1000° C., or a steam oxidation process; and performing a second process at greater than or equal to 1 Bar, within the multi pressure processing chamber, on the film on the substrate, the second process comprising densifying the stabilized film, wherein the second process is an anneal process performed at a temperature of between about 300° C. and about 1000° C.

2. The method of claim 1, wherein:
   performing the first process includes flowing a first process gas composition; and
   performing the second process includes flowing a second process gas composition different than the first process gas composition.

3. The method of claim 1, wherein:
   performing the first process includes converting the film to a different composition.

4. The method of claim 1, wherein:
   the first process is performed including flowing a first process gas including oxygen, ozone, nitrous oxide, nitric oxide, or a combination thereof; and
   the second process is performed including flowing a second process gas including steam, ammonia, nitrous oxide, nitric oxide, or a combination thereof.

5. The method of claim 1, wherein:
   the first process is performed including flowing a first process gas including ammonia; and
   the second process is performed including flowing a second process gas including steam, nitrous oxide, nitric oxide, or a combination thereof.

6. The method of claim 1, wherein:
   the first process is performed including flowing a first process gas including steam and is performed at a first pressure and at a first temperature; and
   the second process is performed including flowing a second process gas including steam, ammonia, nitrous oxide, nitric oxide, or a combination thereof and is performed at a second pressure and at a second temperature, the second pressure being greater than the first pressure, the second temperature being greater than the first temperature.

7. The method of claim 1, wherein the multi pressure processing chamber comprises:
   an inner processing chamber disposed within and in an outer processing chamber, the first process being performed in the outer chamber and the second process being performed in the inner chamber; and
   a valve assembly comprising a first state wherein the valve assembly isolates the inner chamber from the outer chamber and a second state wherein the inner chamber and the outer chamber are in fluid communication.

* * * * *